(12) United States Patent
Lee et al.

(10) Patent No.: US 10,651,195 B2
(45) Date of Patent: May 12, 2020

(54) THREE-DIMENSIONAL SEMICONDUCTOR MEMORY DEVICE

(71) Applicant: SAMSUNG ELECTRONICS CO., LTD., Suwon-si, Gyeonggi-Do (KR)

(72) Inventors: Kyunghwan Lee, Hwaseong-si (KR); Yongseok Kim, Suwon-si (KR); Byoung-Taek Kim, Hwaseong-si (KR); Tae Hun Kim, Gwacheon-si (KR); Dongkyun Seo, Seoul (KR); Junhee Lim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/168,219

(22) Filed: Oct. 23, 2018

(65) Prior Publication Data

US 2019/0139983 A1    May 9, 2019

(30) Foreign Application Priority Data

Nov. 9, 2017  (KR) .......................... 10-2017-0148953

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 27/1157* (2013.01); *H01L 27/11524* (2013.01);
(Continued)

(58) Field of Classification Search
CPC ......... H01L 27/11582; H01L 27/11565; H01L 29/517; H01L 29/42352; H01L 29/518;
(Continued)

(56) References Cited

U.S. PATENT DOCUMENTS 7,679,133 B2   3/2010   Son et al.
8,519,471 B2   8/2013   Kuk et al.
(Continued)

FOREIGN PATENT DOCUMENTS

KR   1020130007816   1/2013

OTHER PUBLICATIONS

English Machine Translation: Kim, Gi-Seok; 2008, 2008-0030273; Non-volatile memory device and fabrication method thereof.*
(Continued)

*Primary Examiner* — Caleen O Sullivan
(74) *Attorney, Agent, or Firm* — F. Chau & Associates, LLC

(57) ABSTRACT

A three-dimensional semiconductor memory device includes an electrode structure including gate electrodes and insulating layers, which are alternately stacked on a substrate, a semiconductor pattern extending in a first direction substantially perpendicular to a top surface of the substrate and penetrating the electrode structure, a tunnel insulating layer disposed between the semiconductor pattern and the electrode structure, a blocking insulating layer disposed between the tunnel insulating layer and the electrode structure, and a charge storing layer disposed between the blocking insulating layer and the tunnel insulating layer. The charge storing layer includes a plurality of first charge trap layers having a first energy band gap, and a second charge trap layer having a second energy band gap larger than the first energy band gap. The first charge trap layers are embedded in the second charge trap layer between the gate electrodes and the semiconductor pattern.

20 Claims, 29 Drawing Sheets

(51) Int. Cl.
*H01L 27/1157* (2017.01)
*H01L 29/423* (2006.01)
*H01L 29/51* (2006.01)
*H01L 27/11556* (2017.01)
*H01L 27/11524* (2017.01)

(52) U.S. Cl.
CPC .. *H01L 27/11556* (2013.01); *H01L 27/11565* (2013.01); *H01L 29/42352* (2013.01); *H01L 29/517* (2013.01); *H01L 29/518* (2013.01)

(58) Field of Classification Search
CPC ........... H01L 27/1157; H01L 27/11524; H01L 27/11556
USPC ........................................................ 257/324
See application file for complete search history.

(56) References Cited

U.S. PATENT DOCUMENTS

| | | | |
|---|---|---|---|
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,816,424 B2 | 8/2014 | Lee et al. | |
| 9,166,032 B1 | 10/2015 | Higuchi et al. | |
| 9,337,198 B2 | 5/2016 | Kwon et al. | |
| 9,368,510 B1 | 6/2016 | Rabkin et al. | |
| 9,384,995 B2 | 7/2016 | Simsek-Ege et al. | |
| 9,455,261 B1 | 9/2016 | Sun et al. | |
| 9,553,146 B2 | 1/2017 | Zhang et al. | |
| 9,666,593 B2 | 5/2017 | Pang et al. | |
| 9,786,675 B2 | 10/2017 | Jung et al. | |
| 9,831,269 B2 | 11/2017 | Kamigaichi | |
| 2008/0042192 A1* | 2/2008 | Park | H01L 29/4234 257/324 |
| 2009/0230461 A1 | 9/2009 | Lee | |
| 2011/0233648 A1 | 9/2011 | Seol et al. | |
| 2012/0049268 A1* | 3/2012 | Chang | H01L 27/11551 257/324 |
| 2013/0087843 A1 | 4/2013 | Han | |
| 2013/0087846 A1 | 4/2013 | Lee et al. | |
| 2014/0264532 A1 | 9/2014 | Dennison et al. | |
| 2014/0286098 A1 | 9/2014 | Yasuda | |
| 2015/0194440 A1 | 7/2015 | Noh et al. | |
| 2016/0093392 A1 | 3/2016 | Sakamoto | |
| 2016/0133752 A1 | 5/2016 | Hopkins et al. | |
| 2016/0240550 A1 | 8/2016 | Jung et al. | |
| 2016/0293623 A1 | 10/2016 | Simsek-Ege et al. | |
| 2017/0263613 A1 | 9/2017 | Murakoshi et al. | |
| 2017/0263780 A1 | 9/2017 | Sawa et al. | |

OTHER PUBLICATIONS

Fu, J., et al, "Trap Layer Engineered Gate-All-Around Vertically Stacked Twin Si-Nanowire Nonvolatile Memory", 2007 IEEE, pp. 79-82.

Ahn, Young Joon, et al., "Trap Layer Engineered FinFET NAND Flash With Enhanced Memory Window", 2006 Symposium on VLSI Technology Digest of Technical Papers.

* cited by examiner

THREE-DIMENSIONAL SEMICONDUCTOR MEMORY DEVICE

CROSS-REFERENCE TO RELATED APPLICATIONS

This application claims priority under 35 U.S.C. § 119 to Korean Patent Application No. 10-2017-0148953, filed on Nov. 9, 2017, the disclosure of which is incorporated by reference herein in its entirety.

TECHNICAL FIELD

Exemplary embodiments of the present inventive concept relate to a three-dimensional semiconductor memory device, and more particularly, to a three-dimensional semiconductor memory device having improved reliability and increased integration density.

DISCUSSION OF THE RELATED ART

Higher integration of semiconductor devices is an important factor that contributes to satisfying consumer demands for superior performance and inexpensive prices relating to products including semiconductor devices. In the case of two-dimensional or planar semiconductor devices, since their integration is primarily determined by the area occupied by a unit memory cell, integration is greatly influenced by the level of a fine pattern forming technology. However, the expensive process equipment needed to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

Exemplary embodiments of the inventive concept provide a three-dimensional semiconductor memory device having improved reliability and increased integration density.

According to exemplary embodiments of the inventive concept, a three-dimensional semiconductor memory device includes an electrode structure including a plurality of gate electrodes and a plurality of insulating layers, which are alternately stacked on a substrate, a semiconductor pattern extending in a first direction substantially perpendicular to a top surface of the substrate and penetrating the electrode structure, a tunnel insulating layer disposed between the semiconductor pattern and the electrode structure, a blocking insulating layer disposed between the tunnel insulating layer and the electrode structure, and a charge storing layer disposed between the blocking insulating layer and the tunnel insulating layer. The charge storing layer includes a plurality of first charge trap layers, each of which has a first energy band gap, and a second charge trap layer, which has a second energy band gap larger than the first energy band gap. The first charge trap layers are embedded in the second charge trap layer between the gate electrodes and the semiconductor pattern.

According to exemplary embodiments of the inventive concept, a three-dimensional semiconductor memory device includes an electrode structure including a plurality of gate electrodes and a plurality of insulating layers, which are alternately stacked on a substrate. A side surface of the electrode structure is recessed in areas corresponding to the gate electrodes to define a plurality of recess regions. The three-dimensional semiconductor memory device further includes a semiconductor pattern extending in a first direction substantially perpendicular to a top surface of the substrate and crossing the side surface of the electrode structure, a plurality of first charge trap layers, which are respectively disposed in the recess regions of the electrode structure and surround the semiconductor pattern, a tunnel insulating layer disposed between the first charge trap layers and the semiconductor pattern, a blocking insulating layer disposed between the first charge trap layers and the electrode structure, and a second charge trap layer. The second charge trap layer continuously extends between the blocking insulating layer and the first charge trap layers and between the tunnel insulating layer and the first charge trap layers. The first charge trap layers are formed of a material having a first energy band gap, and the second charge trap layer is formed of a material having a second energy band gap larger than the first energy band gap.

According to exemplary embodiments of the inventive concept, a three-dimensional semiconductor memory device includes an electrode structure including a plurality of gate electrodes and a plurality of insulating layers, which are alternately stacked on a substrate, a semiconductor pattern extending in a first direction substantially perpendicular to a top surface of the substrate and penetrating the electrode structure, a tunnel insulating layer disposed between the semiconductor pattern and the electrode structure, a blocking insulating layer disposed between the tunnel insulating layer and the electrode structure, and a charge storing layer disposed between the blocking insulating layer and the tunnel insulating layer. The charge storing layer has a first thickness in first regions adjacent to the gate electrodes, and a second thickness, which is less than the first thickness, in second regions adjacent to the insulating layers. The charge storing layer includes a plurality of first charge trap layers, which are respectively disposed in the first regions, and a second charge trap layer. The first charge trap layers have a first energy band gap, and the second charge trap layer has a second energy band gap greater than the first energy band gap.

According to exemplary embodiments of the inventive concept, a charge storing layer of a three-dimensional semiconductor memory device includes a plurality of first charge trap layers having a first energy band gap, and a second charge trap layer having a second energy band gap larger than the first energy band gap. The first charge trap layers are embedded in the second charge trap layer between gate electrodes of the three-dimensional semiconductor memory device and a semiconductor pattern of the three-dimensional semiconductor memory device.

BRIEF DESCRIPTION OF THE DRAWINGS

Exemplary embodiments of the inventive concept will become more apparent by describing in detail exemplary embodiments thereof with reference to the accompanying drawings, in which.

DETAILED DESCRIPTION OF THE EXEMPLARY EMBODIMENTS

Figure 1:
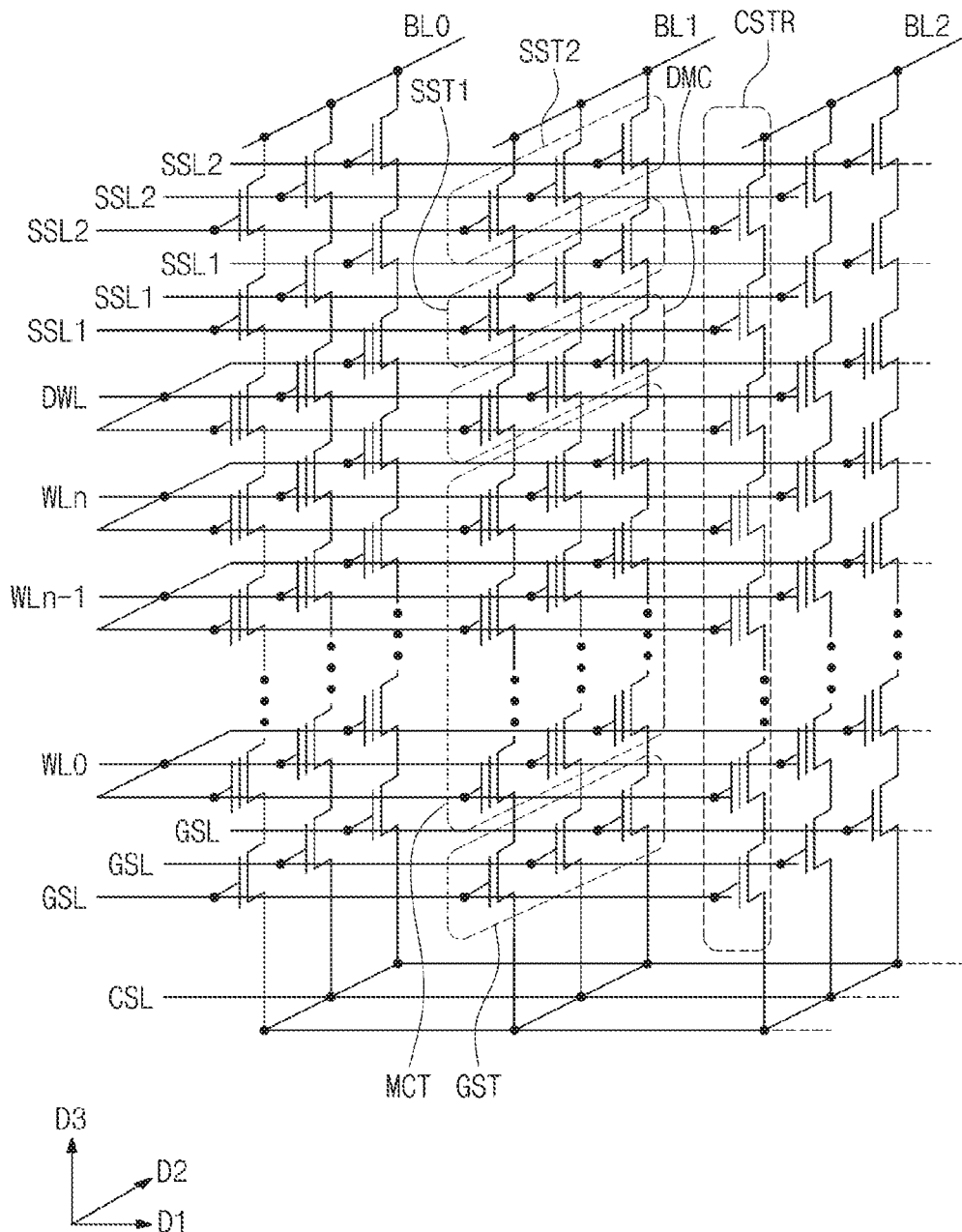
FIG. 1 is a circuit diagram illustrating a cell array of a three-dimensional semiconductor memory device according to exemplary embodiments of the inventive concept.

Exemplary embodiments of the inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

As used herein, the singular forms "a", "an" and "the" are intended to include the plural forms as well, unless the context clearly indicates otherwise.

It will be understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a circuit diagram illustrating a cell array of a three-dimensional semiconductor memory device according to exemplary embodiments of the inventive concept.

Referring to FIG. 1, in an exemplary embodiment, a cell array of a three-dimensional semiconductor memory device includes a common source line CSL, a plurality of bit lines BL0-BL2, and a plurality of cell strings CSTR disposed between the common source line CSL and the bit lines BL0-BL2BL.

The cell strings CSTR are disposed on a plane that is substantially parallel to first and second directions D1 and D2, extends in a third direction D3. The bit lines BL0-BL2 are spaced apart from one another in the first direction D1 and extend in the second direction D2.

A plurality of the cell strings CSTR is connected substantially in parallel to each of the bit lines BL0-BL2. The plurality of the cell strings CSTR is connected in common to the common source line CSL. For example, the plurality of the cell strings CSTR is disposed between the bit lines BL0-BL2 and the common source line CSL. A plurality of the common source lines CSL may be two-dimensionally arranged. The same voltage may be applied to the common source lines CSL, or the common source lines CSL may be independently controlled.

In exemplary embodiments, each of the cell strings CSTR includes string selection transistors SST1 and SST2, which are connected in series, memory cell transistors MCT, which are connected in series, and a ground selection transistor GST. Each of the memory cell transistors MCT includes a data storage element.

As an example, each of the cell strings CSTR may include first and second string selection transistors SST1 and SST2, which are connected in series, the second string selection transistors SST2 may be coupled to the bit lines BL0-BL2, and the ground selection transistor GST may be coupled to the common source line CSL. The memory cell transistors MCT may be disposed between the first string selection transistor SST1 and the ground selection transistor GST to be connected in series to one another.

In exemplary embodiments, each of the cell strings CSTR further includes a dummy cell DMC, which is provided between and connected to the first string selection transistor SST1 and the memory cell transistor MCT. Another dummy cell may be disposed between and connected to the ground selection transistor GST and the memory cell transistor MCT. In exemplary embodiments, in each of the cell strings CSTR, the ground selection transistor GST includes a plurality of metal-oxide-semiconductor (MOS) transistors, which are connected in series, similar to the first and second string selection transistors SST1 and SST2. In exemplary embodiments, each of the cell strings CSTR includes a single string selection transistor.

In exemplary embodiments, the first string selection transistor SST1 is controlled by a first string selection line SSL1, and the second string selection transistor SST2 is controlled by a second string selection line SSL2. The memory cell transistors MCT are controlled by a plurality of word lines WL0-WLn (where n is an integer equal to at least 2), and the dummy cells DMC are controlled by a dummy word line DWL. The ground selection transistor GST is controlled by a ground selection line GSL. The common source line CSL is connected in common to sources of the ground selection transistors GST.

In exemplary embodiments, each of the cell strings CSTR includes a plurality of the memory cell transistors MCT located at different distances from the common source lines CSL. The plurality of word lines WL0-WLn and the dummy word line DWL are disposed between the common source lines CSL and the bit lines BL0-BL2.

In exemplary embodiments, gate electrodes GE of the memory cell transistors MCT, which are placed at substantially the same distance from the common source lines CSL, are connected in common to one of the word lines WL0-WLn and DWL, thereby being in an equipotential state. In exemplary embodiments, some of the gate electrodes GE of the memory cell transistors MCT, which are placed at substantially the same level from the common source lines CSL and are arranged in different rows or column, may be independently controlled.

The ground selection lines GSL and the string selection lines SSL1 and SSL2 extend in the first direction D1, and are spaced apart from one another in the second direction D2. Although the ground selection lines GSL or the string selection lines SSL1 and SSL2 are located at substantially the same distance from the common source lines CSL, they may be electrically separated from each other.

Figure 2:
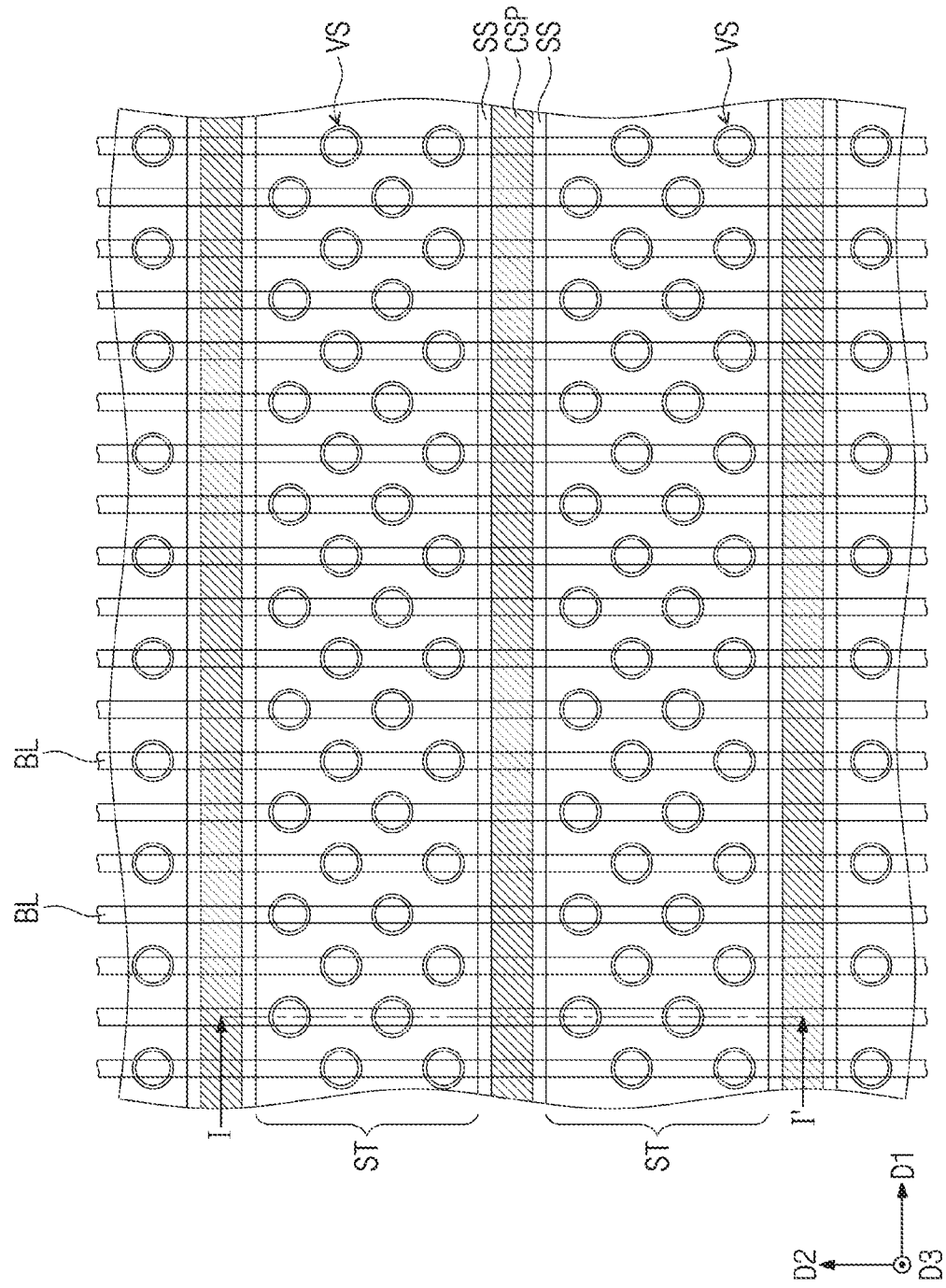
FIG. 2 is a plan view illustrating a cell array of a three-dimensional semiconductor memory device according to exemplary embodiments of the inventive concept.
Figure 3:
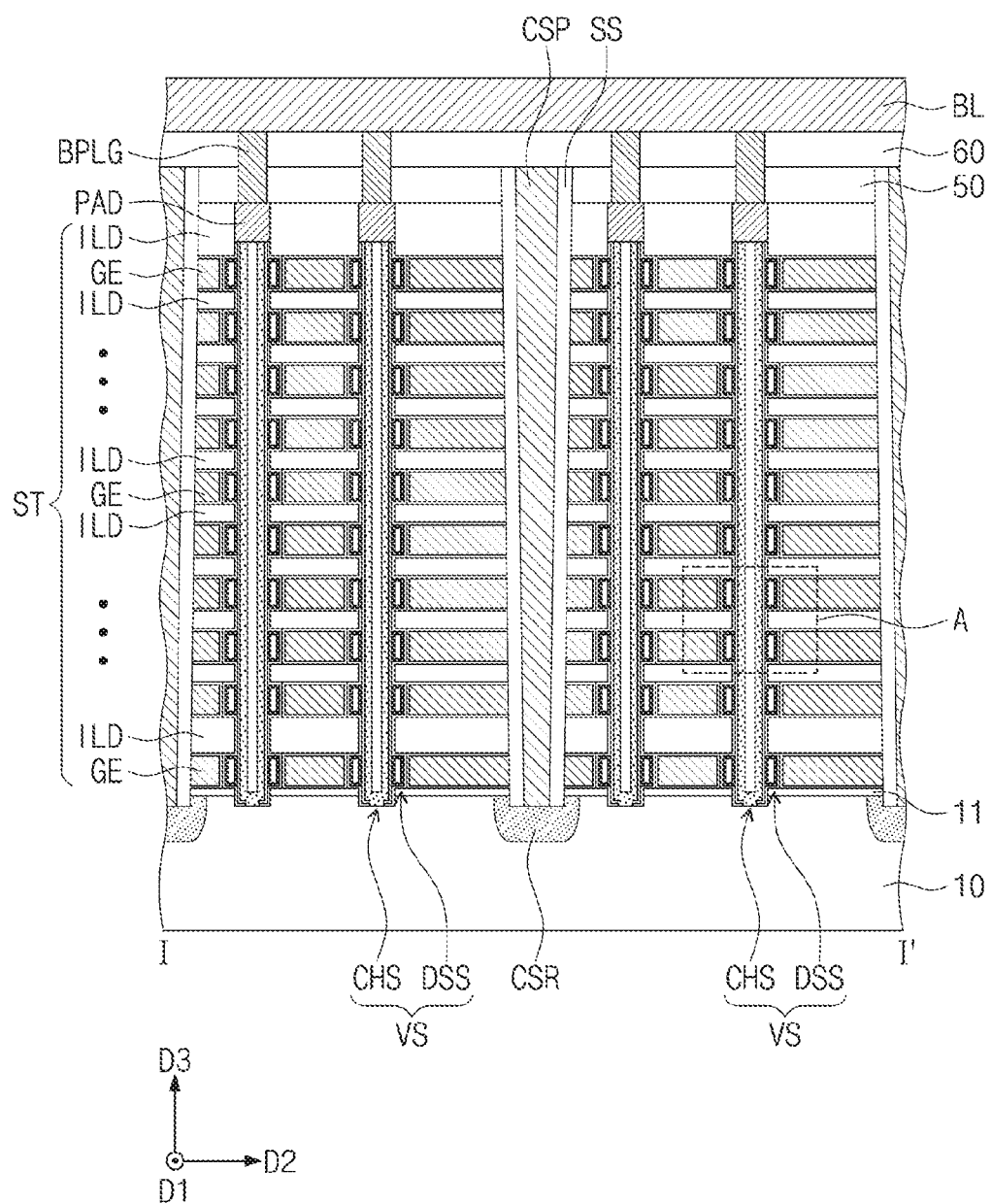
FIGS. 3 and 4 are cross-sectional views illustrating three-dimensional semiconductor memory devices according to exemplary embodiments of the inventive concept, taken along line I-I' of FIG. 2.
Figure 4:
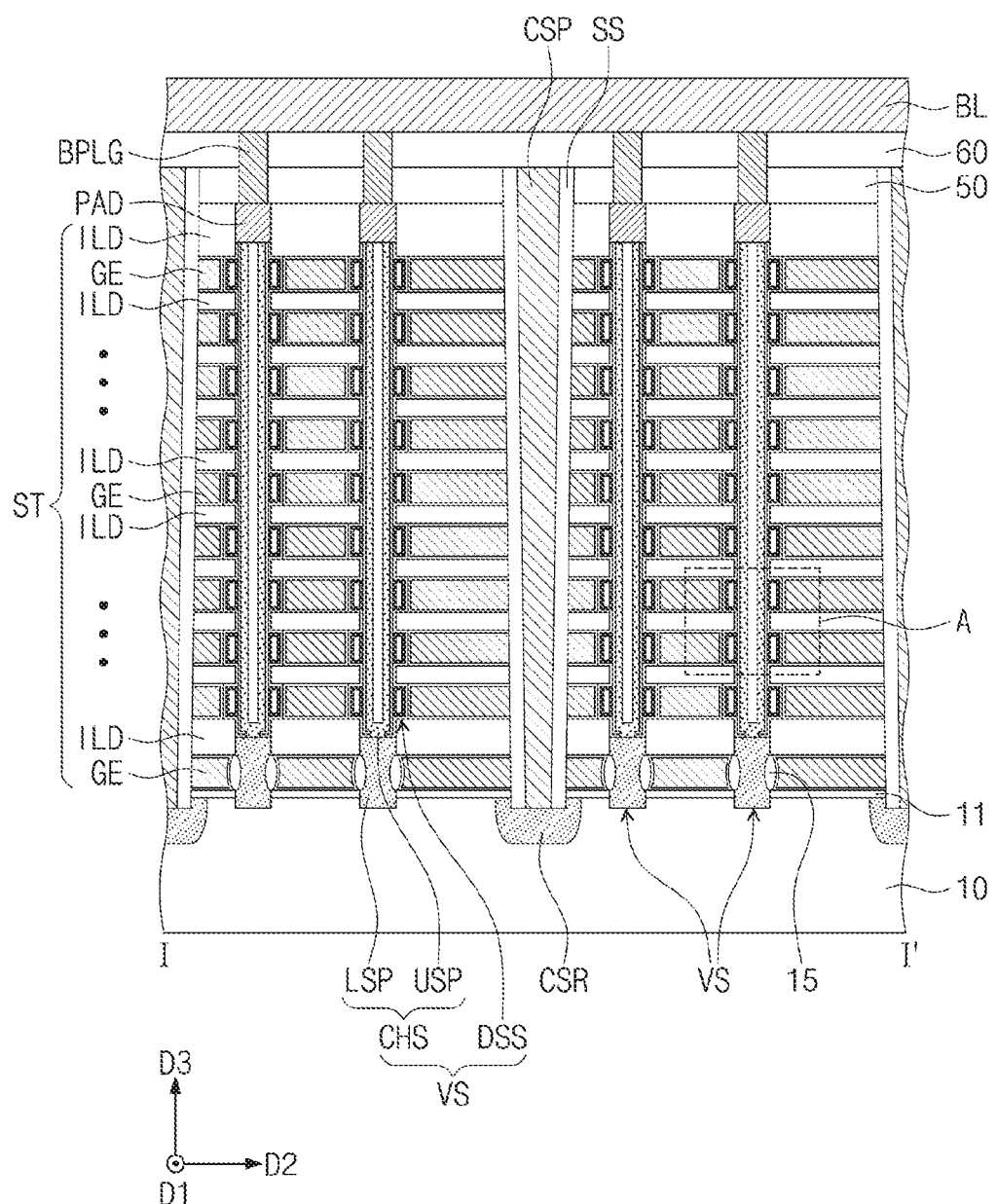
Figure 5A:
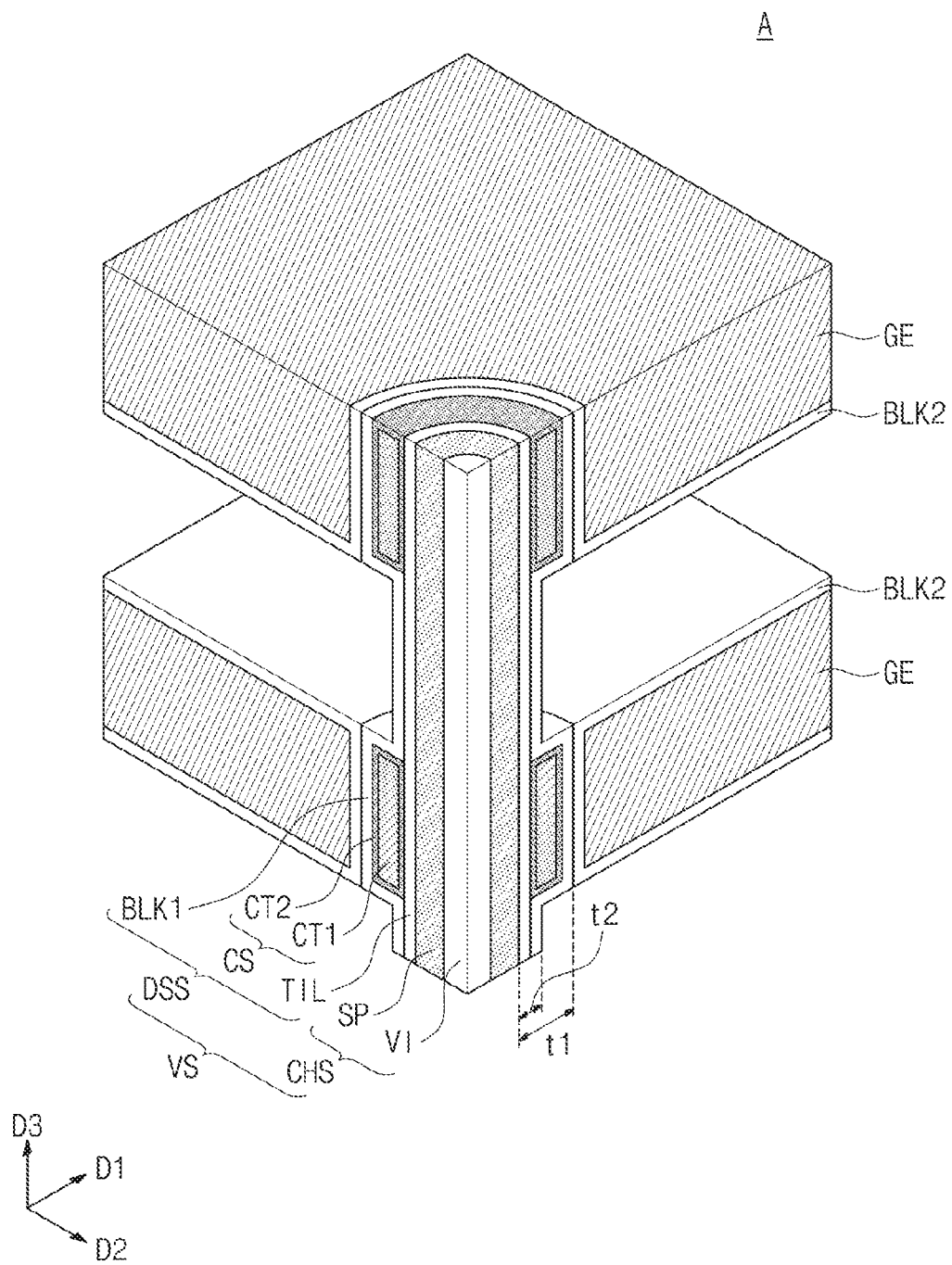
FIGS. 5A and 5B are diagrams illustrating a data storing structure of a three-dimensional semiconductor memory device according to exemplary embodiments of the inventive concept.
Figure 5B:
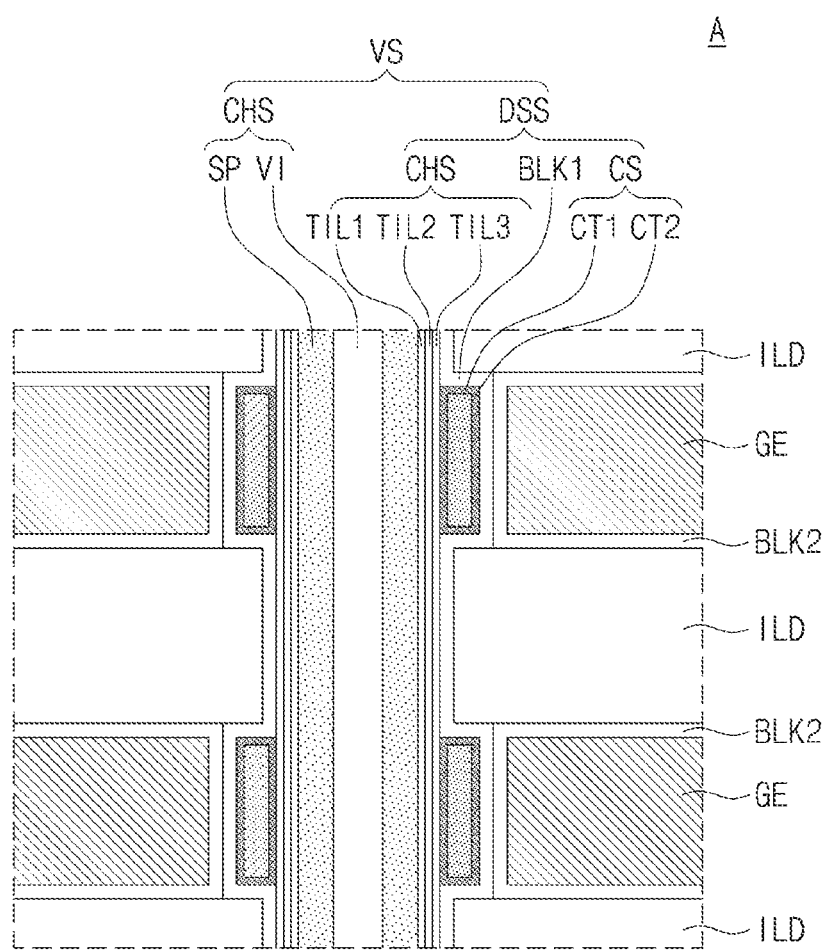
Figure 6A:
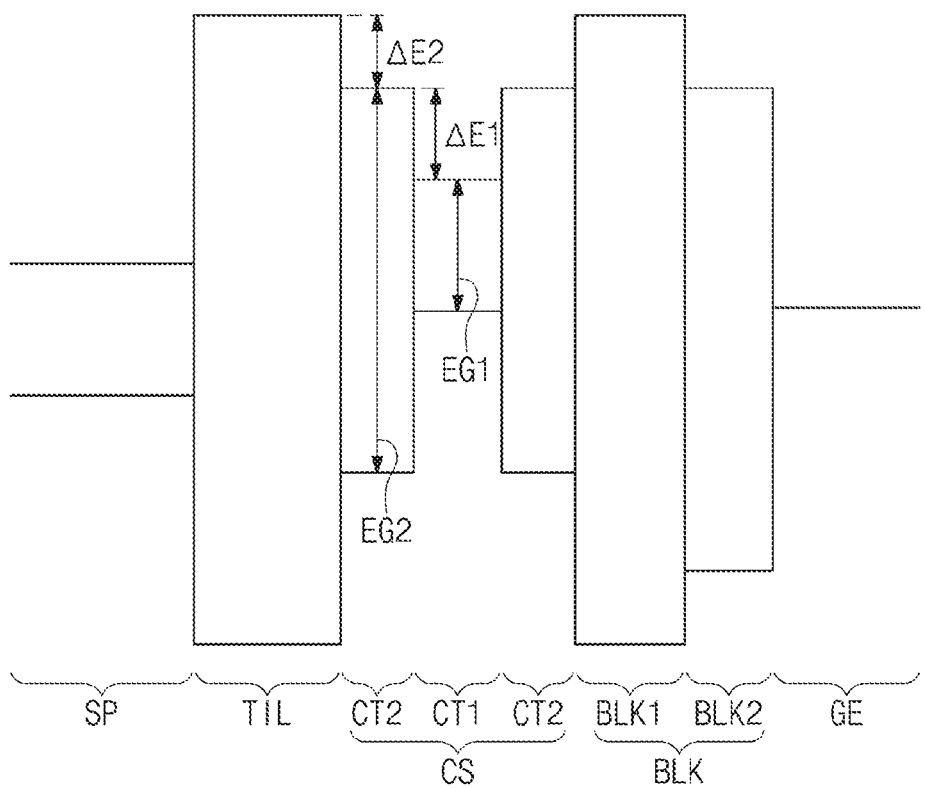
FIGS. 6A and 6B are flat band diagrams illustrating energy band structures of three-dimensional semiconductor memory devices according to exemplary embodiments of the inventive concept.
Figure 6B:
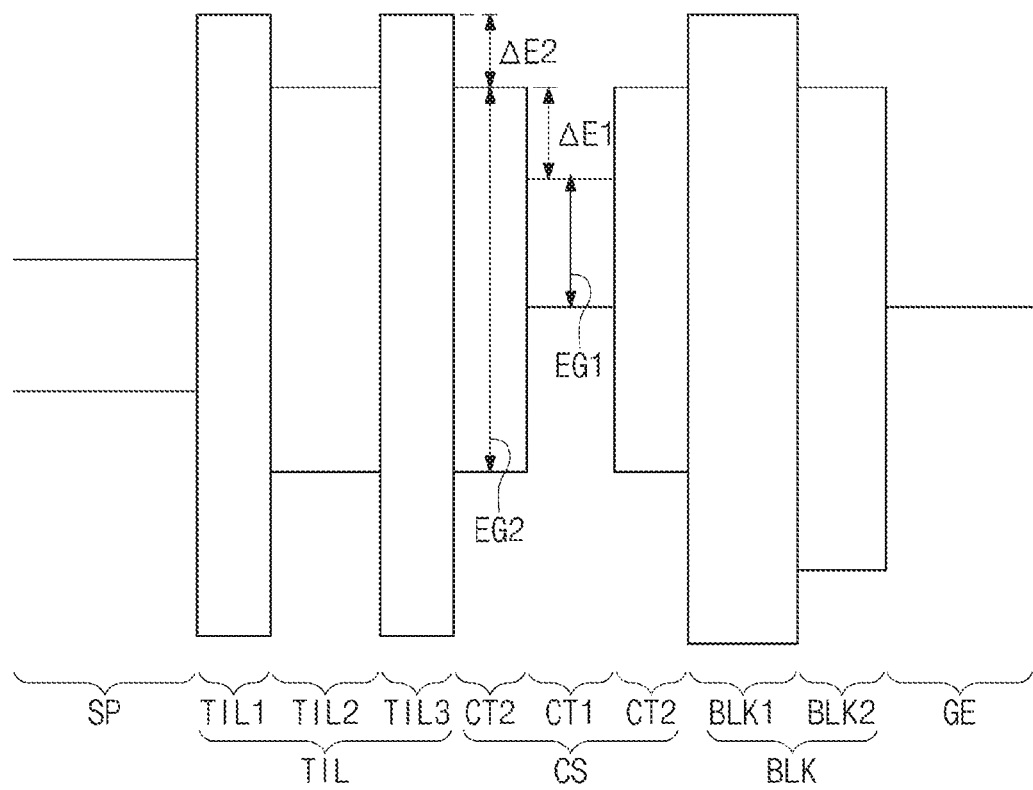

FIG. 2 is a plan view illustrating a cell array of a three-dimensional semiconductor memory device according to exemplary embodiments of the inventive concept. FIGS. 3 and 4 are cross-sectional views illustrating three-dimensional semiconductor memory devices according to exemplary embodiments of the inventive concept, taken along line I-I' of FIG. 2. FIGS. 5A and 5B are diagrams illustrating a data storing structure of a three-dimensional semiconductor memory device according to exemplary embodiments of the inventive concept. FIGS. 5A and 5B illustrate a portion of a three-dimensional semiconductor memory device according to exemplary embodiments of the inventive concept (e.g., a portion A of FIG. 3, 4 or 8). FIGS. 6A and 6B are flat band diagrams illustrating energy band structures of three-dimensional semiconductor memory devices according to exemplary embodiments of the inventive concept.

Referring to FIGS. 2 and 3, in exemplary embodiments, electrode structures ST are disposed on a top surface of a substrate 10. The electrode structures ST extend in the first direction D1 and are spaced apart from one another in the second direction D2, where the first and second directions D1 and D2 are orthogonal to each other and are substantially parallel to the top surface of the substrate 10.

The substrate 10 may include at least one of, for example, a semiconductor material (e.g., silicon), an insulating material (e.g., glass), or a semiconductor or conductive material covered with an insulating material. For example, the substrate 10 may be a silicon wafer having a first conductivity type.

A buffer insulating layer 11 is disposed between the electrode structure ST and the substrate 10. The buffer insulating layer 11 may include, for example, a silicon oxide layer.

The electrode structure ST includes gate electrodes GE and insulating layers ILD, which are alternately and repeatedly stacked on the top surface of the substrate 10 in the third direction D3 normal to the top surface. The gate electrodes GE may have substantially the same thickness, and the insulating layers ILD may have thicknesses that are dependent on the type of the semiconductor memory device. The gate electrodes GE may be formed of or include at least one of, for example, doped semiconductors (e.g., doped silicon), metals (e.g., tungsten, copper, aluminum, etc.), conductive metal nitrides (e.g., titanium nitride, tantalum nitride, etc.), or transition metals (e.g., titanium, tantalum, etc.). The insulating layers ILD may include, for example, a silicon oxide layer or a low-k dielectric layer. In exemplary embodiments, the three-dimensional semiconductor memory device may be the vertical-type NAND FLASH memory device described with reference to FIG. 1. In this case, the gate electrodes GE of the electrode structure ST may be used as the ground selection lines GSL, the word lines WL0-WLn and DWL, and the string selection lines SSL1 and SSL2 described with reference to FIG. 1.

In exemplary embodiments, each of the gate electrodes GE has a side surface that is laterally offset from a side surface of the insulating layer ILD. For example, a side surface of the electrode structure ST adjacent to a vertical structure VS may be disposed to define recess regions between vertically adjacent insulating layers ILD. As an example, in exemplary embodiments, when measured in the first or second direction D1 or D2 substantially parallel to the top surface of the substrate 10, the side surfaces of the insulating layers ILD are spaced apart from a side surface of a semiconductor pattern SP (see FIG. 5A) by a first distance, whereas the side surfaces of the gate electrodes GE are spaced apart from the side surface of the semiconductor pattern SP by a second distance, which is larger than the first distance.

In exemplary embodiments, a plurality of the vertical structures VS is disposed to extend in the third direction D3, which is normal to the top surface of the substrate 10, and thereby penetrates a corresponding one of the electrode structures ST. The vertical structures VS are arranged to form a plurality of columns in the first direction D1. In exemplary embodiments, the vertical structures VS are provided to form a zigzag arrangement in the first and second directions D1 and D2 when viewed in a plan view.

According to exemplary embodiments, each of the vertical structures VS includes a channel structure CHS and a data storing structure DSS.

Referring to FIGS. 3 and 5A, in exemplary embodiments, the channel structure CHS includes the semiconductor pattern SP and a buried insulating pattern VI. The semiconductor pattern SP of the channel structure CHS may be in direct contact with the substrate 10, and may be, for example, a U-shaped hollow pattern, or may be shaped like a bottom-closed pipe or macaroni. An internal empty space of the semiconductor pattern SP may be filled with the buried insulating pattern VI. The semiconductor pattern SP may be formed of or include at least one of, for example, semiconductor materials (e.g., silicon (Si), germanium (Ge), or mixtures thereof). In addition, the semiconductor pattern SP may be a doped semiconductor pattern or an intrinsic semiconductor pattern. The semiconductor pattern SP may be used as channel regions of the selection transistors SST and GST and the memory cell transistors MCT described with reference to FIG. 1.

Referring to FIG. 4, in an exemplary embodiment, each of the channel structures CHS includes lower and upper semiconductor patterns LSP and USP and the buried insulating pattern VI. The lower semiconductor pattern LSP may be in direct contact with the substrate 10 and may include a pillar-shaped epitaxial layer grown from the substrate 10. The lower semiconductor pattern LSP may be formed of, for example, silicon (Si), In exemplary embodiments, the lower semiconductor pattern LSP may include at least one of germanium (Ge), silicon-germanium (SiGe), III-V semiconductor compounds, and/or II-VI semiconductor compounds. The lower semiconductor pattern LSP may be, for example, an undoped pattern, or may be a doped pattern having the same conductivity type as that of the substrate 10.

In exemplary embodiments, a top surface of the lower semiconductor pattern LSP is located at a level that is higher than a top surface of the lowermost one of the gate electrodes GE, and is lower than a bottom surface of the lowermost insulating layer ILD on the lowermost one of the gate electrodes GE, as shown in FIG. 4. A gate insulating layer 15 may be disposed on a portion of the side surface of the lower semiconductor pattern LSP. The gate insulating layer 15 may be disposed between the lowermost one of the gate electrodes GE and the lower semiconductor pattern LSP. The gate insulating layer 15 may include, for example, a silicon oxide layer (e.g., a thermally-grown oxide layer). The gate insulating layer 15 may have a rounded side surface.

The upper semiconductor pattern USP may be in direct contact with the lower semiconductor pattern LSP, and may be shaped like a bottom-closed pipe or may be a 'U'-shaped pattern. An internal space of the upper semiconductor pattern USP may be filled with the buried insulating pattern VI including an insulating material. The upper semiconductor pattern USP may be surrounded by the data storing structure DSS. A bottom surface of the upper semiconductor pattern USP may be located at a level that is lower than the top surface of the lower semiconductor pattern LSP. The upper semiconductor pattern USP may be formed of or include an undoped semiconductor material or a doped semiconductor material having substantially the same conductivity type as that of the substrate 10. In exemplary embodiments, the upper semiconductor pattern USP may have at least one of, for example, a single- or poly-crystalline or amorphous structure. In exemplary embodiments, the upper semiconductor pattern USP may have a different crystal structure from that of the lower semiconductor pattern LSP.

In exemplary embodiments, a bit line conductive pad PAD, which is formed of a conductive material, is provided on or in a top portion of each of the channel structures CHS. As an example, the bit line conductive pad PAD may be formed of a doped semiconductor material.

In exemplary embodiments, the data storing structure DSS is disposed between the channel structure CHS and the electrode structure ST. The data storing structure DSS extends in the third direction D3 and surrounds the side surface of the channel structure CHS. The data storing structure DSS may be used as a data storing layer in the NAND FLASH memory device, and may be configured in such a way that data stored therein can be changed using a voltage difference between the channel structure CHS and the electrodes GE or using a Fowler-Nordheim tunneling effect caused by such a voltage difference.

Referring again to FIGS. 3 and 5A, in exemplary embodiments, the data storing structure DSS includes first portions adjacent to the gate electrodes GE and second portions adjacent to the insulating layers ILD. When measured in a direction normal to the side surface of the channel structure CHS, a thickness t1 of the first portions is larger than a thickness t2 of the second portions. The data storing structure DSS includes a tunnel insulating layer TIL, a charge storing layer CS, and a first blocking insulating layer BLK1.

The charge storing layer CS is disposed between the tunnel insulating layer TIL and the first blocking insulating layer BLK1. The charge storing layer CS may be formed of or include at least one of materials whose energy band gaps are less than those of the tunnel insulating layer TIL and the first blocking insulating layer BLK1.

Referring to FIGS. 5A and 6A, in exemplary embodiments, the charge storing layer CS includes a first charge trap layer CT1 having a first energy band gap EG1 and a second charge trap layer CT2 having a second energy band gap EG2. In exemplary embodiments, the first charge trap layer CT1 is embedded in the second charge trap layer CT2. The first energy band gap EG1 is smaller than the second energy band gap EG2. In addition, the second energy band gap EG2 of the second charge trap layer CT2 is smaller than an energy band gap of the tunnel insulating layer TIL. A difference in conduction band energy level between the first and second charge trap layers CT1 and CT2 (hereinafter referred to as a potential barrier ΔE1) is greater than a difference in conduction band energy level between the tunnel insulating layer TIL and the second charge trap layer CT2 (hereinafter referred to as ΔE2). As an example, the first charge trap layer CT1 may be formed of or include, for example, a poly-silicon layer, a germanium (Ge) layer, or a metal (e.g., tungsten (W), nickel (Ni), platinum (Pt)) layer, and the second charge trap layer CT2 may be formed of or include, for example, a silicon nitride layer or a silicon oxynitride layer.

Referring again to FIG. 5A, in exemplary embodiments, the charge storing layer CS includes a plurality of patterns that are spaced apart from one another in the third direction D3. In exemplary embodiments, the charge storing layer CS is not disposed between the insulating layers ILD and the channel structure CHS. In exemplary embodiments, the first charge trap layer CT1 of the charge storing layer CS surrounds a portion of the semiconductor pattern SP adjacent to the gate electrode GE. In exemplary embodiments, the second charge trap layer CT2 completely encloses (e.g., completely surrounds) the first charge trap layer CT1. For example, the first charge trap layer CT1 may be covered by the second charge trap layer CT2 in all directions (e.g., the first, second, and third directions D1, D2, and D3). For example, in exemplary embodiments, the second charge trap layer CT2 includes vertical portions, which are disposed between the tunnel insulating layer TIL and the first charge trap layer CT1 and between the first blocking insulating layer BLK1 and the first charge trap layer CT1, and horizontal portions, which are extended from the vertical portions to cover top and bottom surfaces of the first charge trap layer CT1. In exemplary embodiments, the second charge trap layer CT2 is thinner than the first charge trap layer CT1 when measured in the first or second direction D1 or D2. Furthermore, in exemplary embodiments, the second charge trap layer CT2 is also thinner than the tunnel insulating layer TIL.

Various structures of the data storing structure DSS according to exemplary embodiments of the inventive concept will be described in more detail with reference to FIGS. 9A to 9H.

Referring still to FIG. 5A, in exemplary embodiments, the tunnel insulating layer TIL is disposed between the gate electrodes GE and the channel structure CHS. The tunnel insulating layer TIL may be formed of or include, for example, at least one of materials whose band gaps are greater than that of the charge storing layer CS. The tunnel insulating layer TIL encloses the side surface of the semiconductor pattern SP, extends in the third direction D3, and may have a uniform thickness. For example, the tunnel insulating layer TIL may be a silicon oxide layer, which is formed by a chemical vapor deposition process or an atomic layer deposition process. Alternatively, the tunnel insulating layer TIL may be formed of or include at least one of high-k dielectric materials (e.g., aluminum oxide and hafnium oxide).

Referring to FIGS. 5B and 6B, in exemplary embodiments, the tunnel insulating layer TIL includes a plurality of thin layers. For example, as shown in FIG. 5B, in an exemplary embodiment, the tunnel insulating layer TIL includes first, second, and third tunnel insulating layers TIL1, TIL2, and TIL3, which are sequentially stacked on the side surface of the channel structure CHS. The second tunnel insulating layer TIL2 has an energy band gap that is smaller than those of the first and third tunnel insulating layers TIL1 and TIL3, as shown in FIG. 6B. Since the second tunnel insulating layer TIL2 having a small energy band gap is disposed between the first and third tunnel insulating layers TIL1 and TIL3, the tunnel insulating layer TIL may allow holes to be more easily tunneled during an erase operation of the three-dimensional semiconductor memory device.

The first and second tunnel insulating layers TIL1 and TIL2 may be formed of or include, for example, a nitrogen-containing material (e.g., silicon nitride or silicon oxynitride). The third tunnel insulating layer TIL3 may be formed of or include, for example, silicon oxide.

In exemplary embodiments, the first blocking insulating layer BLK1 is disposed between the gate electrodes GE and the tunnel insulating layer TIL, and may be formed of or include, for example, at least one of materials whose band gaps are smaller than that of the tunnel insulating layer TIL and are greater than that of the charge storing layer CS. An effective dielectric constant of the first blocking insulating layer BLK1 may be greater than that of the tunnel insulating layer TIL. For example, the first blocking insulating layer BLK1 may be formed of or include at least one of, for example, high-k dielectric materials (e.g., aluminum oxide and hafnium oxide). In exemplary embodiments, the first blocking insulating layer BLK1 has a substantially uniform thickness and extends in the third direction D3. In exemplary embodiments, the first blocking insulating layer BLK1 is in contact with the tunnel insulating layer TIL between vertically adjacent gate electrodes GE, and surrounds the charge storing layer CS between vertically adjacent insulating layers ILD.

In addition, in exemplary embodiments, a second blocking insulating layer BLK2 is disposed between the channel structures CHS and the side surfaces of the gate electrodes GE, and extends to cover top and bottom surfaces of each of the gate electrodes GE. The second blocking insulating layer BLK2 may be, for example, a single layer or a plurality of thin layers. The second blocking insulating layer BLK2 may be formed of or include, for example, at least one of high-k dielectric materials (e.g., aluminum oxide and hafnium oxide). In exemplary embodiments, the second blocking insulating layer BLK2 is formed of or includes at least one of materials whose dielectric constants are different from that of the first blocking insulating layer BLK1. In exemplary embodiments, the second blocking insulating layer BLK2 is omitted.

In the figures, BLK may collectively refer to the first blocking insulating layer BLK1 and the second blocking insulating layer BLK2. As shown in FIG. 5A, in exemplary embodiments, the second charge trap layer CT2 continuously extends (e.g., extends without any breaks or openings) between the blocking insulating layer BLK and the first charge trap layer CT1, and continuously extends between the tunnel insulating layer TIL and the first charge trap layer CT1.

Referring again to FIGS. 2 and 3, in exemplary embodiments, common source regions CSR are disposed in the substrate 10 and between the electrode structures ST. The common source regions CSR extend in the first direction D1 or substantially parallel to the electrode structures ST, and are spaced apart from one another in the second direction D2. For example, each of the electrode structures ST is disposed between adjacent common source regions CSR. In exemplary embodiments, the common source regions CSR may be formed by injecting impurities having a second conductivity type into the substrate 10, which has the first conductivity type different from the second conductivity type. For example, the common source regions CSR may be formed to contain n-type impurities (e.g., arsenic (As) or phosphorus (P)).

In exemplary embodiments, a first interlayered insulating layer 50 is disposed on the electrode structures ST, and covers the top surfaces of the vertical structures VS.

In exemplary embodiments, a common source plug CSP is disposed between the electrode structures ST and is coupled to the common source region CSR, and an insulating spacer SS is disposed between the common source plug CSP and the side surfaces of the electrode structures ST. As an example, the common source plug CSP may be formed to have a substantially uniform upper width, and may extend in the first direction D1.

In exemplary embodiments, a second interlayered insulating layer 60 is disposed on the first interlayered insulating layer 50, and covers a top surface of the common source plug CSP.

In exemplary embodiments, bit lines BL, which include the bit lines BL0-BL2, extend in the second direction D2, are disposed on the second interlayered insulating layer 60, and cross the electrode structures ST. The bit lines BL may be coupled to the bit line conductive pads PAD through bit line contact plugs BPLG. For example, the bit lines BL are electrically connected to the channel structures CHS.

Figure 7A:
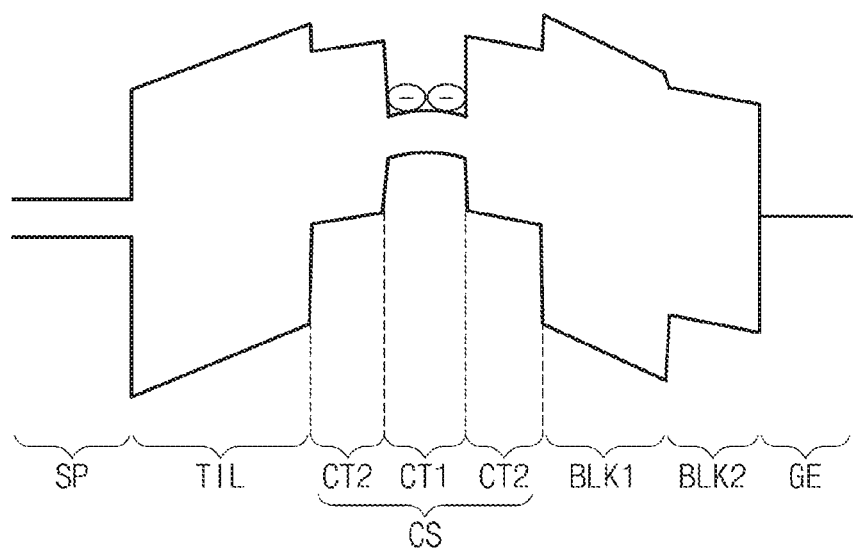
FIGS. 7A and 7B are energy band diagrams referred to for describing charge retention properties of three-dimensional semiconductor memory devices according to exemplary embodiments of the inventive concept.
Figure 7B:
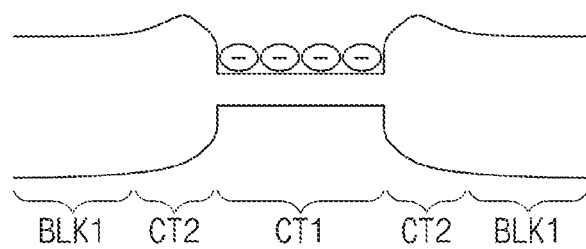

FIGS. 7A and 7B are energy band diagrams referred to for describing charge retention properties of three-dimensional semiconductor memory devices according to exemplary embodiments of the inventive concept. FIG. 7A is a diagram illustrating an energy band structure in a direction substantially parallel to the top surface of the substrate, and FIG. 7B is a diagram illustrating an energy band structure in a direction substantially perpendicular to the top surface of the substrate.

In a three-dimensional semiconductor memory device according to exemplary embodiments of the inventive concept, during a programming operation, electric charges in the semiconductor pattern SP of the channel structure may pass through the tunnel insulating layer TIL by a Fowler-Nordheim tunneling and may be trapped in the charge storing layer CS. The electric charges, which are trapped in the charge storing layer CS (e.g., the first and second charge trap layers CT1 and CT2), may change a threshold voltage of a memory cell transistor.

During the programming operation, a high voltage may be selectively applied to one of the gate electrodes GE. In this case, since the first charge trap layer CT1 has an energy band gap smaller than that of the second charge trap layer CT2, it is likely that electric charges, which have tunneled through the tunnel insulating layer TIL, are trapped in the first charge trap layer CT1 having a deep trap level.

In the three-dimensional semiconductor memory device according to exemplary embodiments of the inventive concept, once the electric charges are stored in the first and second charge trap layers CT1 and CT2, the program voltage applied to the gate electrode GE may be interrupted to allow the device to be operated in a charge retention mode.

Referring to FIG. 7A, in exemplary embodiments, the charge storing layer CS has a deformed or curved energy band structure, owing to the charges trapped in the charge storing layer CS in the charge retention mode. According to exemplary embodiments, a potential barrier between the first and second charge trap layers CT1 and CT2 is greater than that between the tunnel insulating layer TIL and the second charge trap layer CT2. As a result, it exemplary embodiments reduce an amount of electric charges, which are thermally excited to the conduction band of the first charge trap layer CT1 in the charge retention mode and surmount the potential barrier between the first and second charge trap layers CT1 and CT2 to be leaked to the semiconductor pattern SP. Furthermore, even if electric charges trapped in a shallow trap level (e.g., close to the conduction band) of the second charge trap layer CT2 are thermally excited, the excited electric charges may be re-trapped in the first charge trap layer CT1 because the first charge trap layer CT1 has a conduction band energy level lower than that of the second charge trap layer CT2.

In addition, since the second charge trap layer CT2 encloses the first charge trap layer CT1, exemplary embodiments suppress or prevent the electric charges, which are trapped in the first charge trap layer CT1, from being leaked to the semiconductor pattern SP through the tunnel insulating layer TIL by a band-to-band tunneling.

Referring to FIG. 7B, in exemplary embodiments, the first charge trap layer CT1 is not extended toward the insulating layers ILD between the gate electrodes GE. For example, the first charge trap layer CT1 may be locally formed, and thus, electric charges trapped in the first charge trap layer CT1 may be prevented from being diffused in a vertical direction normal to the top surface of the substrate.

Thus, exemplary embodiments of the inventive concept prevent electric charges from being lost in all directions substantially parallel and substantially perpendicular to the top surface of the substrate in the charge retention mode. As a result, a charge retention property of a three-dimensional semiconductor memory device may be improved according to exemplary embodiments of the inventive concept.

Figure 8:
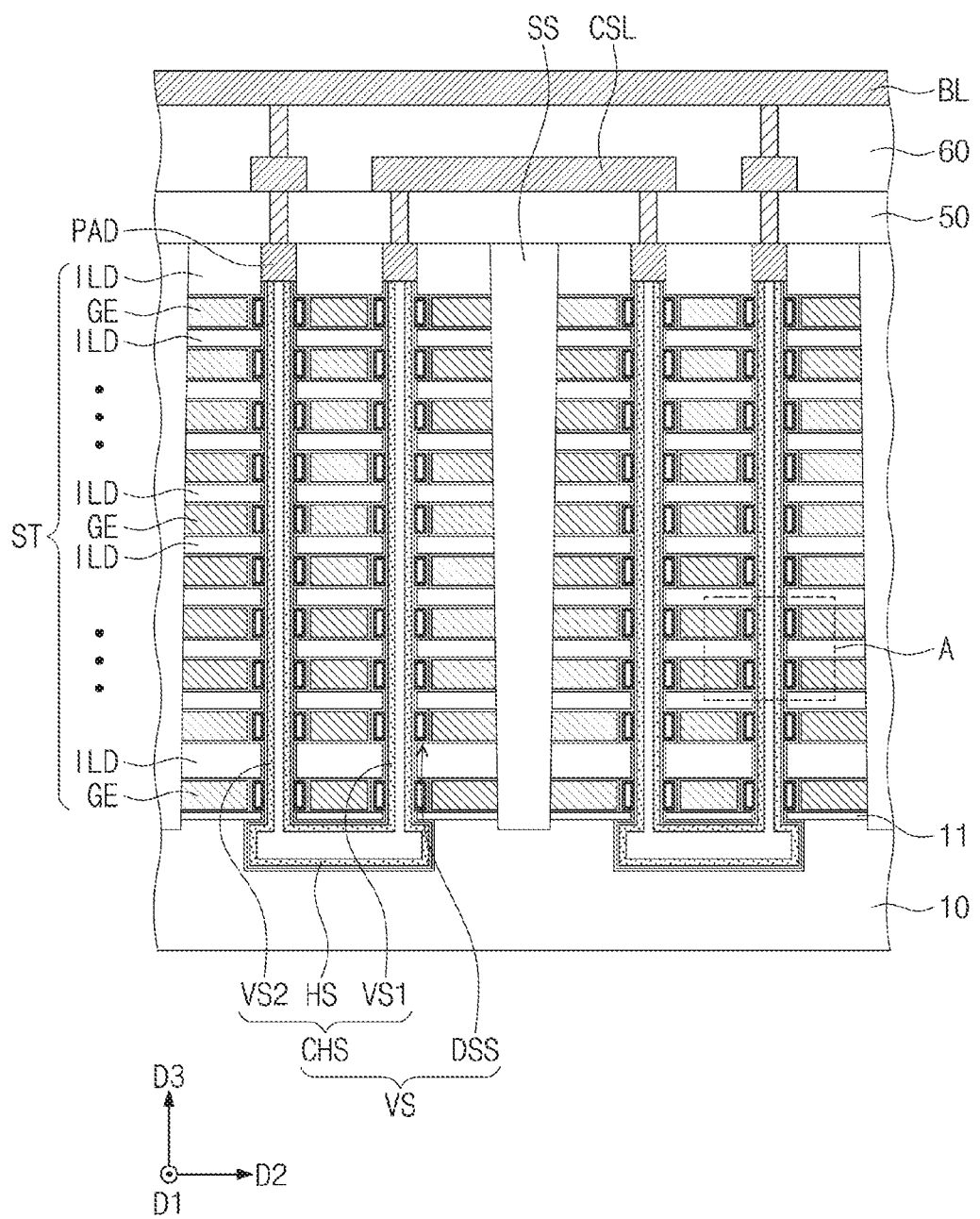
FIG. 8 is a cross-sectional view illustrating a three-dimensional semiconductor memory device according to exemplary embodiments of the inventive concept.

FIG. 8 is a cross-sectional view illustrating a three-dimensional semiconductor memory device according to exemplary embodiments of the inventive concept. For convenience of explanation, elements previously described may be identified by the same reference numerals, and a further description thereof may be omitted.

Referring to FIG. 8, in exemplary embodiments, the electrode structures ST are disposed on the substrate 10 and are spaced apart from one another, and a plurality of the vertical structures VS are disposed such that they penetrate each of the electrode structure ST. Each of the vertical structures VS includes the channel structure CHS and the data storing structure DSS.

In exemplary embodiments, the channel structure CHS includes first and second vertical channels VS1 and VS2 which penetrate the electrode structure ST, and a horizontal channel HS which is disposed below the electrode structure ST and connects the first and second vertical channels VS1 and VS2 to each other. The first and second vertical channels VS1 and VS2 may be disposed in vertical holes that are formed to penetrate the electrode structure ST. The horizontal channel HS may be provided in a recess region formed in the substrate 10. The horizontal channel HS is disposed between the substrate 10 and the electrode structure ST and connects the first and second vertical channels VS1 and VS2 to each other. In exemplary embodiments, the horizontal channel HS may be, for example, a hollow pipe shaped or a macaroni-shaped pattern, which is continuously connected to the first and second vertical channels VS1 and VS2. For example, in exemplary embodiments, the first and second vertical channels VS1 and VS2 and the horizontal channel HS are disposed such that they have a single pipe structure. For example, the first and second vertical channels VS1 and VS2 and the horizontal channel HS may be a single continuous semiconductor layer without interface.

In exemplary embodiments, in each of the channel structures CHS, the first vertical channel VS1 is connected to a bit line BL, and the second vertical channel VS2 is connected to the common source line CSL. In this case, each of the channel structures CHS may be used as channel regions of memory cell transistors and ground and string selection transistors constituting a single cell string.

Furthermore, as described above, in exemplary embodiments, the data storing structure DSS is disposed between the first and second vertical channels VS1 and VS2 and the electrode structures ST and between the horizontal channel HS and the substrate 10.

FIGS. 9A to 9H are cross-sectional views illustrating a portion of a three-dimensional semiconductor memory device according to exemplary embodiments of the inventive concept (e.g., a portion A of FIG. 3, 4, or 8).

According to exemplary embodiments, the data storing structure DSS includes first portions adjacent to the gate electrodes GE, and second portions adjacent to the insulating layers ILD. The first portions are thicker than the second portions. For example, in exemplary embodiments, a thickness of the data storing structure DSS is larger in an area between the side surfaces of the gate electrodes GE and the channel structure CHS than in an area between the side surfaces of the insulating layers ILD and the channel structure CHS. As an example, in exemplary embodiments, a distance from the side surface of the semiconductor pattern SP to the side surface of the gate electrode GE is larger than a distance from the side surface of the semiconductor pattern SP to the side surface of the insulating layer ILD.

In exemplary embodiments, the data storing structure DSS includes the tunnel insulating layer TIL, the charge storing layer CS, and the first blocking insulating layer BLK1, which are sequentially stacked on the side surface of the channel structure CHS. As described above, in exemplary embodiments, the charge storing layer CS includes the first charge trap layer CT1 and the second charge trap layer CT2 having the first energy band gap and the second energy band gap, respectively. The first energy band gap is smaller than the second energy band gap. In exemplary embodiments, the tunnel insulating layer TIL and the first blocking insulating layer BLK1 extend in a direction normal to the top surface of the substrate (e.g., in the third direction D3 of FIG. 3).

Figure 9A:
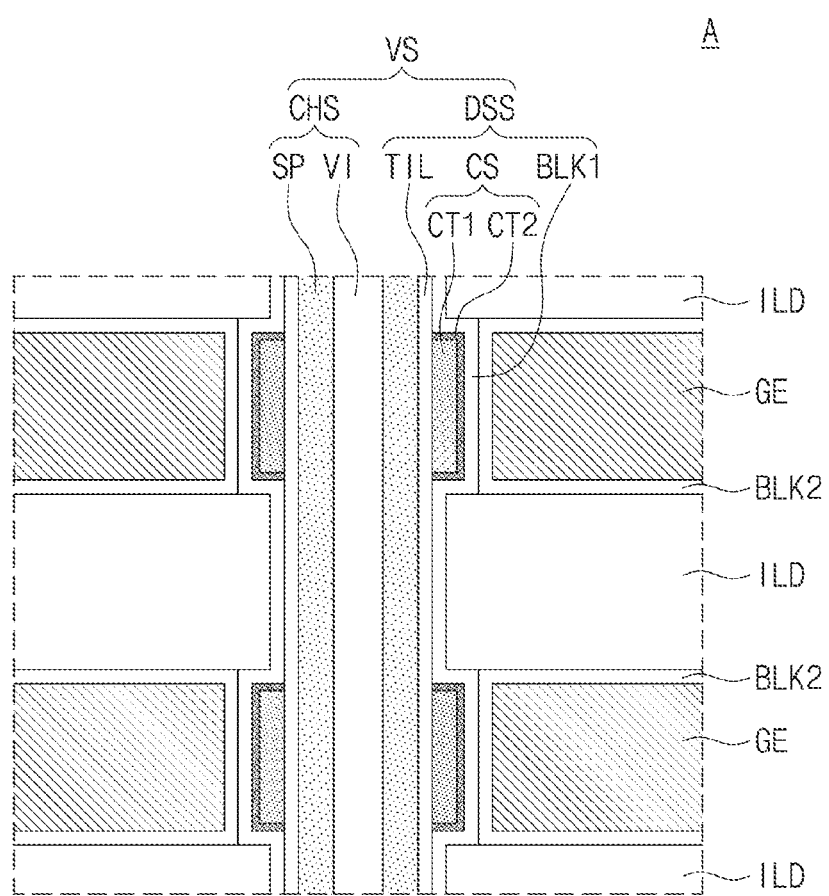
FIGS. 9A to 9H are cross-sectional views illustrating a portion of a three-dimensional semiconductor memory device according to exemplary embodiments of the inventive concept (e.g., a portion A of FIG. 3, 4, or 8).
Figure 9B:
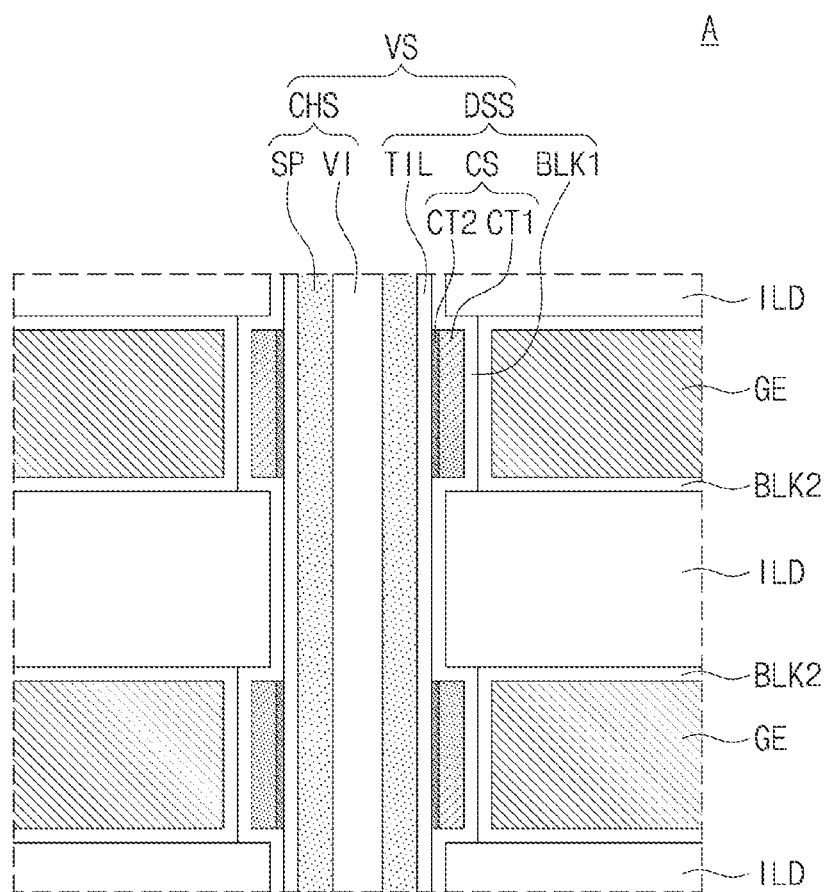

Referring to FIGS. 9A and 9B, in exemplary embodiments, the charge storing layer CS includes a plurality of patterns, which are spaced apart from one another in the third direction D3, and each of which surrounds a portion of the channel structure. In such exemplary embodiments, the charge storing layer CS may not be disposed between the insulating layers ILD and the channel structure CHS.

Referring to FIG. 9A, in exemplary embodiments, the first charge trap layer CT1 surrounds a portion of the semiconductor pattern SP adjacent to the gate electrode GE, and is in direct contact with the tunnel insulating layer TIL. The second charge trap layer CT2 is disposed between the first blocking insulating layer BLK1 and the first charge trap layer CT1, and includes portions covering top and bottom surfaces of the first charge trap layer CT1.

Referring to FIG. 9B, in exemplary embodiments, the first charge trap layer CT1 is disposed such that it is in contact with the first blocking insulating layer BLK1, and the second charge trap layer CT2 is disposed such that it is in contact with the tunnel insulating layer TIL. Top and bottom surfaces of each of the first and second charge trap layers CT1 and CT2 are in contact with the first blocking insulating layer BLK1.

Referring to FIGS. 9C to 9G, in exemplary embodiments, the first charge trap layer CT1 includes a plurality of patterns, which are spaced apart from one another in the third direction D3, and the second charge trap layer CT2 extends in the third direction D3. For example, in exemplary embodiments, each of the patterns of the first charge trap layer CT1 is locally provided between vertically adjacent insulating layers ILD, and surround a portion of the channel structure CHS. In exemplary embodiments, the first charge trap layer CT1 is not disposed between the insulating layers ILD and the channel structure CHS.

Figure 9C:
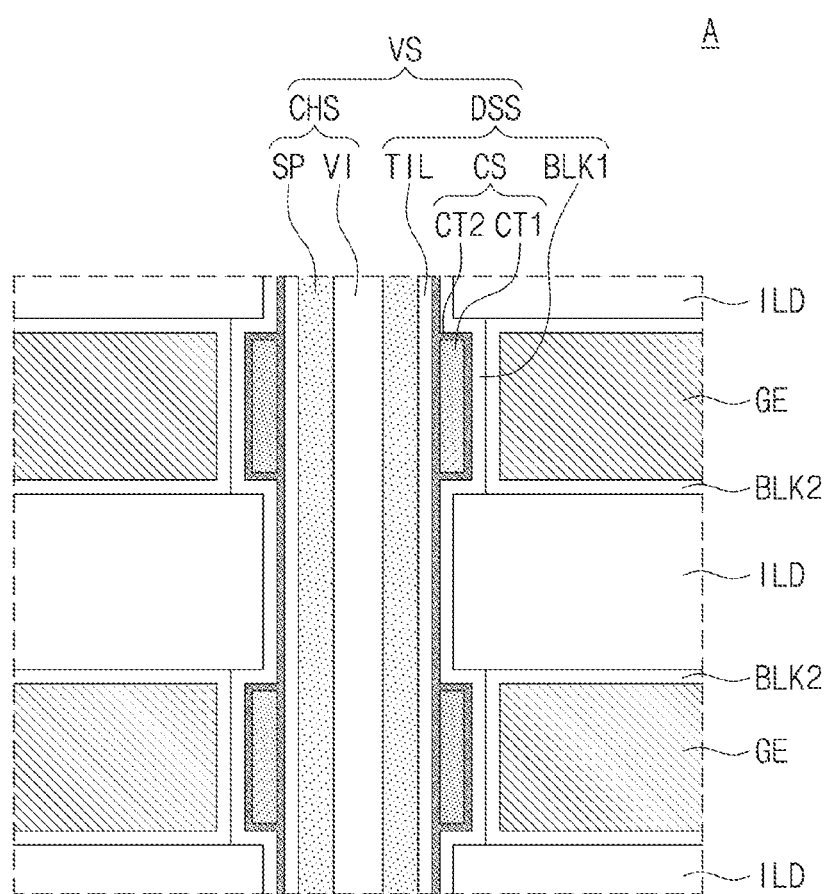

Referring to FIG. 9C, in exemplary embodiments, the second charge trap layer CT2 extends in the third direction D3, and completely surrounds each of the patterns of the first charge trap layer CT1. For example, in a region adjacent to the insulating layers ILD, the second charge trap layer CT2 is disposed between the first blocking insulating layer BLK1 and the tunnel insulating layer TIL. The second charge trap layer CT2 is extended from a region between the insulating layers ILD and the semiconductor pattern to a region between the first blocking insulating layer BLK1 and the first charge trap layer CT1, and to a region between the tunnel insulating layer TIL and the first charge trap layer CT1.

Figure 9D:
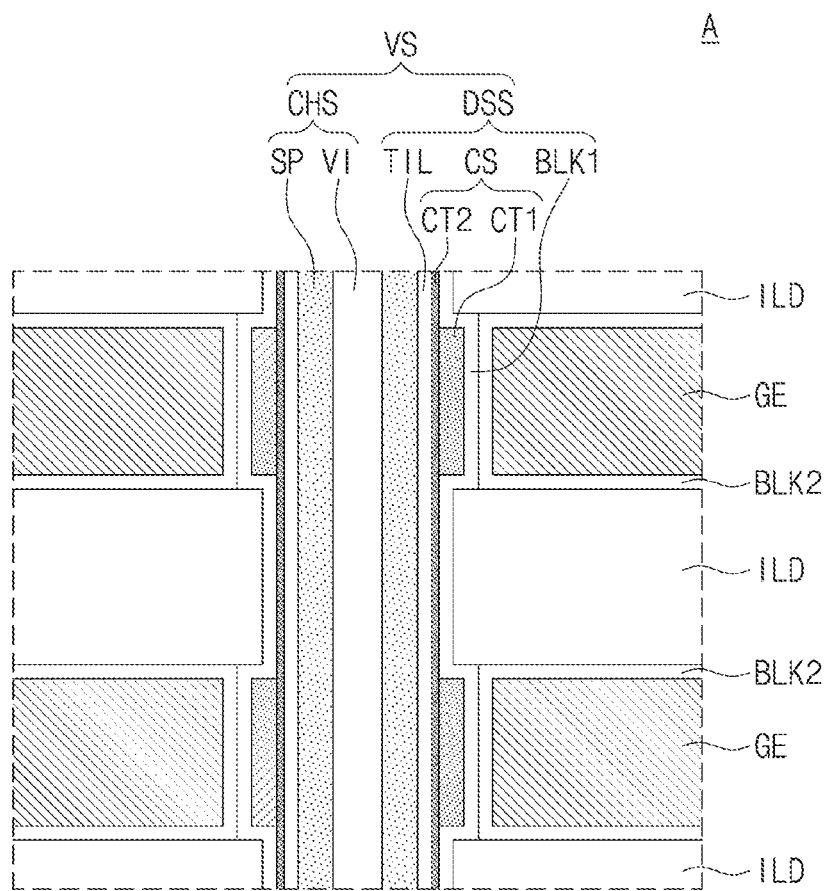

Referring to FIG. 9D, in exemplary embodiments, the first charge trap layer CT1 is disposed such that it surrounds a portion of the channel structure CHS, and is disposed between the first blocking insulating layer BLK1 and the second charge trap layer CT2. Furthermore, top and bottom surfaces of the first charge trap layer CT1 are in contact with the first blocking insulating layer BLK1.

In exemplary embodiments, the second charge trap layer CT2 has a uniform thickness on the tunnel insulating layer TIL. The second charge trap layer CT2 extends in the third direction D3, thereby being disposed between the tunnel insulating layer TIL and the first charge trap layer CT1 and between the tunnel insulating layer TIL and the insulating layers ILD.

Figure 9E:
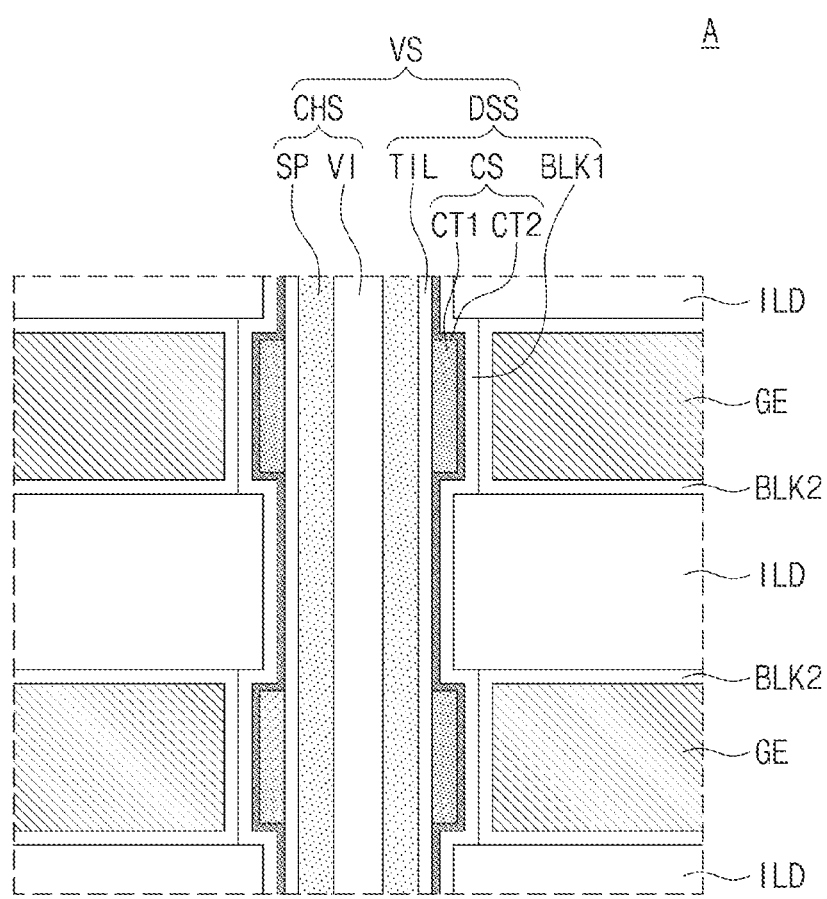

Referring to FIG. 9E, in exemplary embodiments, the first charge trap layer CT1 is disposed between the tunnel insulating layer TIL and the second charge trap layer CT2, and top and bottom surfaces of the first charge trap layer CT1 are in contact with the second charge trap layer CT2.

The second charge trap layer CT2 extends in the third direction D3 and includes portions that are located between the first blocking insulating layer BLK1 and the first charge trap layer CT1, and between the insulating layers ILD and the tunnel insulating layer TIL.

Figure 9F:
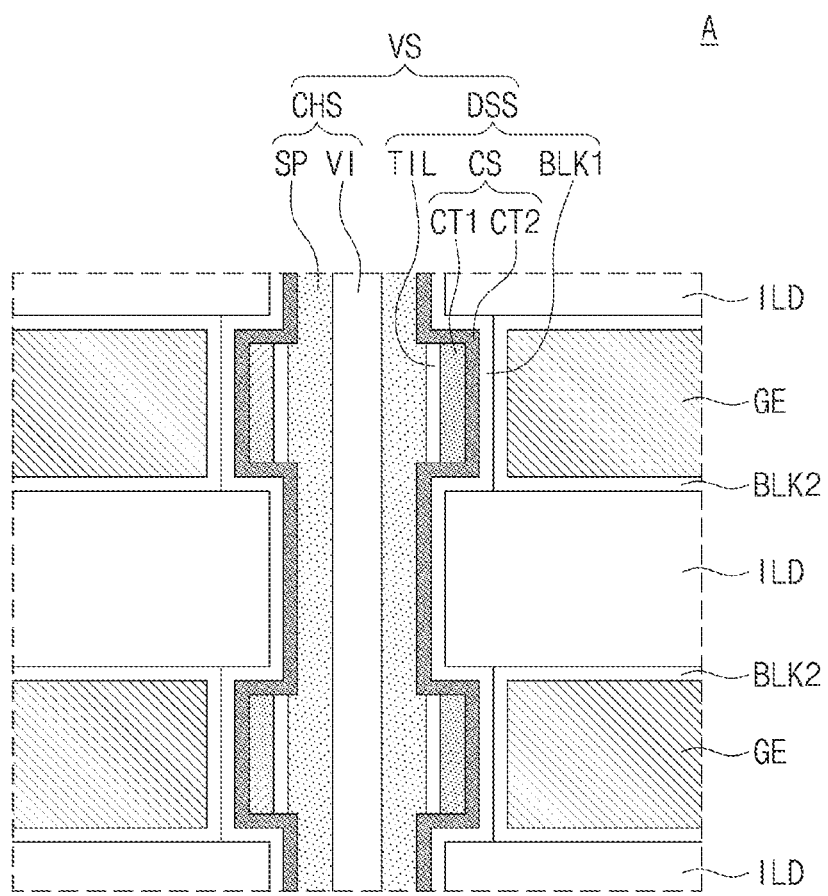
Figure 9G:
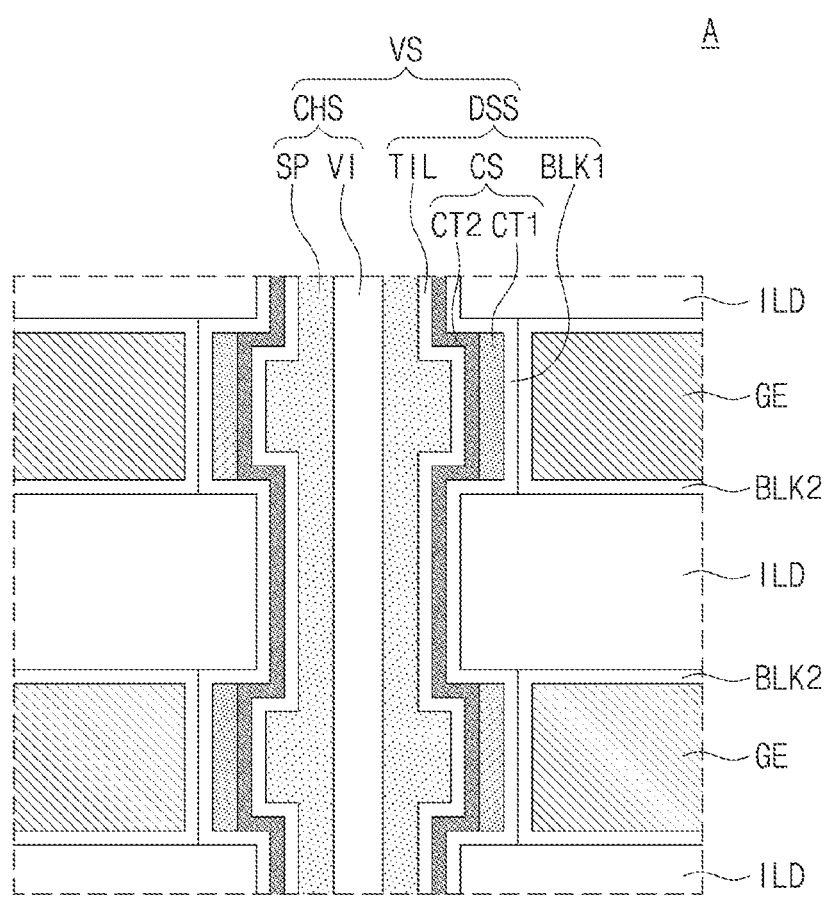
Figure 9H:
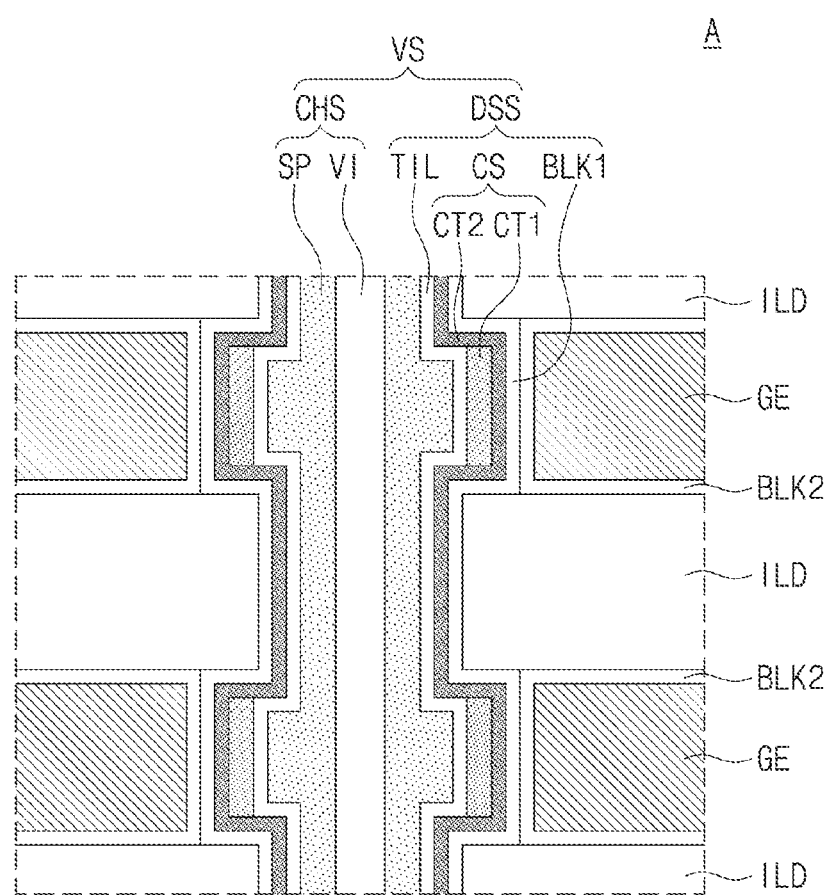

Referring to FIGS. 9F, 9G, and 9H, in exemplary embodiments, the semiconductor pattern SP of the channel structure CHS includes protruding portions laterally extending toward the gate electrodes GE.

Referring to FIG. 9F, in exemplary embodiments, the tunnel insulating layer TIL includes a plurality of patterns, which are spaced apart from one another in the third direction D3, and each of which is in contact with a side surface of each of vertically separated patterns of the first charge trap layer CT1. The first charge trap layer CT1 is disposed between the tunnel insulating layer TIL and the second charge trap layer CT2. The second charge trap layer CT2 extends from a region between the first blocking insulating layer BLK1 and the first charge trap layer CT1 to a region between the insulating layers ILD and the channel structure CHS. The second charge trap layer CT2 is disposed such that it is in contact with top and bottom surfaces of the first charge trap layer CT1 and the tunnel insulating layer TIL.

Referring to FIG. 9G, in exemplary embodiments, the first blocking insulating layer BLK1 is disposed between the first charge trap layer CT1 and the gate electrode GE, and extends such that it covers the top and bottom surfaces of the first charge trap layer CT1. Furthermore, the first blocking insulating layer BLK1 extends in the third direction D3 such that it is disposed between the insulating layers ILD and the channel structure CHS.

In exemplary embodiments, each of the tunnel insulating layer TIL and the second charge trap layer CT2 is disposed between the channel structure CHS and the first blocking insulating layer BLK1, and extends in the third direction D3 to surround the protruding portions of the channel structure CHS.

Referring to FIG. 9H, in exemplary embodiments, the first blocking insulating layer BLK1 and the second charge trap layer CT2 are disposed between the gate electrode GE and the first charge trap layer CT1. The second charge trap layer CT2 covers bottom and top surfaces of the first charge trap layer CT1, and extends in the third direction D3 such that it is disposed between the insulating layers ILD and the tunnel insulating layer TIL.

In exemplary embodiments, the tunnel insulating layer TIL is in direct contact with a side surface of the first charge trap layer CT1, and extends in the third direction D3 such that it is disposed between the channel structure CHS and the second charge trap layer CT2. In addition, in exemplary embodiments, the tunnel insulating layer TIL conformally covers the protruding portions of the channel structure CHS. For example, the tunnel insulating layer TIL may have a shape corresponding to that of the protruding portions of the channel structure CHS in areas in which the tunnel insulating layer TIL covers the protruding portions.

FIGS. 10 to 15 are cross-sectional views taken along line I-I' of FIG. 2 illustrating a method of fabricating a three-dimensional semiconductor memory device according to exemplary embodiments of the inventive concept.

Figure 10:
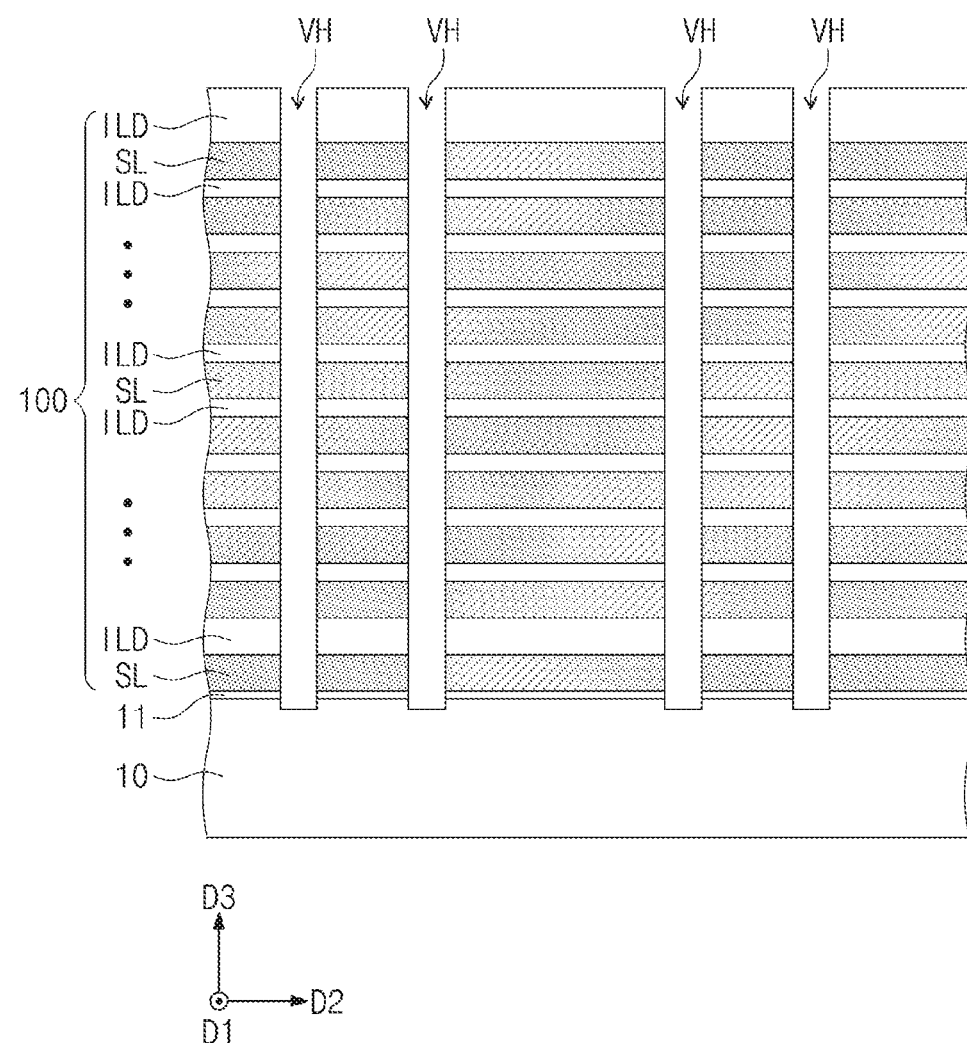
FIGS. 10 to 15 are cross-sectional views taken along line I-I' of FIG. 2 illustrating a method of fabricating a three-dimensional semiconductor memory device according to exemplary embodiments of the inventive concept.

Referring to FIGS. 2 and 10, in exemplary embodiments, the buffer insulating layer 11 is formed on the substrate 10, and then, a mold structure 100 is formed on the buffer insulating layer 11. The mold structure 100 may be formed by alternately and repeatedly stacking sacrificial layers SL and insulating layers ILD on the buffer insulating layer 11.

In the mold structure 100, the sacrificial layers SL may be formed of a material that can be selectively etched with respect to the insulating layers ILD. For example, materials for the sacrificial layers SL and the insulating layers ILD may be selected to have a high etch selectivity in a wet etching process and a low etch selectivity in a dry etching process. As an example, the sacrificial layers SL and the insulating layers ILD may be formed of insulating materials that have an etch selectivity with respect to each other. In exemplary embodiments, the sacrificial layers SL may be formed of an insulating material different from the insulating layers ILD. For example, the sacrificial layers SL may be formed of at least one selected from the group of silicon, silicon oxide, silicon carbide, silicon germanium, silicon oxynitride, or silicon nitride, whereas the insulating layers ILD may be formed of at least one that is selected from the group but is different from that of the sacrificial layers SL. As an example, in exemplary embodiments, the sacrificial layers SL are formed of silicon nitride, and the insulating layers ILD are formed of silicon oxide. In exemplary embodiments, the sacrificial layers SL are formed of a conductive material, and the insulating layers ILD are formed of an insulating material.

The sacrificial layers SL and the insulating layers ILD may be deposited using at least one of, for example, thermal chemical vapor deposition (thermal CVD), plasma-enhanced CVD, physical CVD, or atomic layer deposition (ALD) methods.

Thereafter, a plurality of vertical holes VH are formed to penetrate the mold structure 100. The formation of the vertical holes VH may include, for example, forming a mask pattern on the mold structure 100 and anisotropically etching the mold structure 100 using the mask pattern as an etch mask. The anisotropic etching process may be performed to etch the top surface of the substrate 10 in an over-etching manner, and thus, the top surface of the substrate 10 exposed by the vertical holes VH may be recessed to a specific depth. Furthermore, as a result of the anisotropic etching process, the vertical holes VH may be formed to have a lower width that is smaller than an upper width. In addition, when viewed in a plan view, the vertical holes VH may be arranged in a line or in a zigzag shape.

Figure 11:
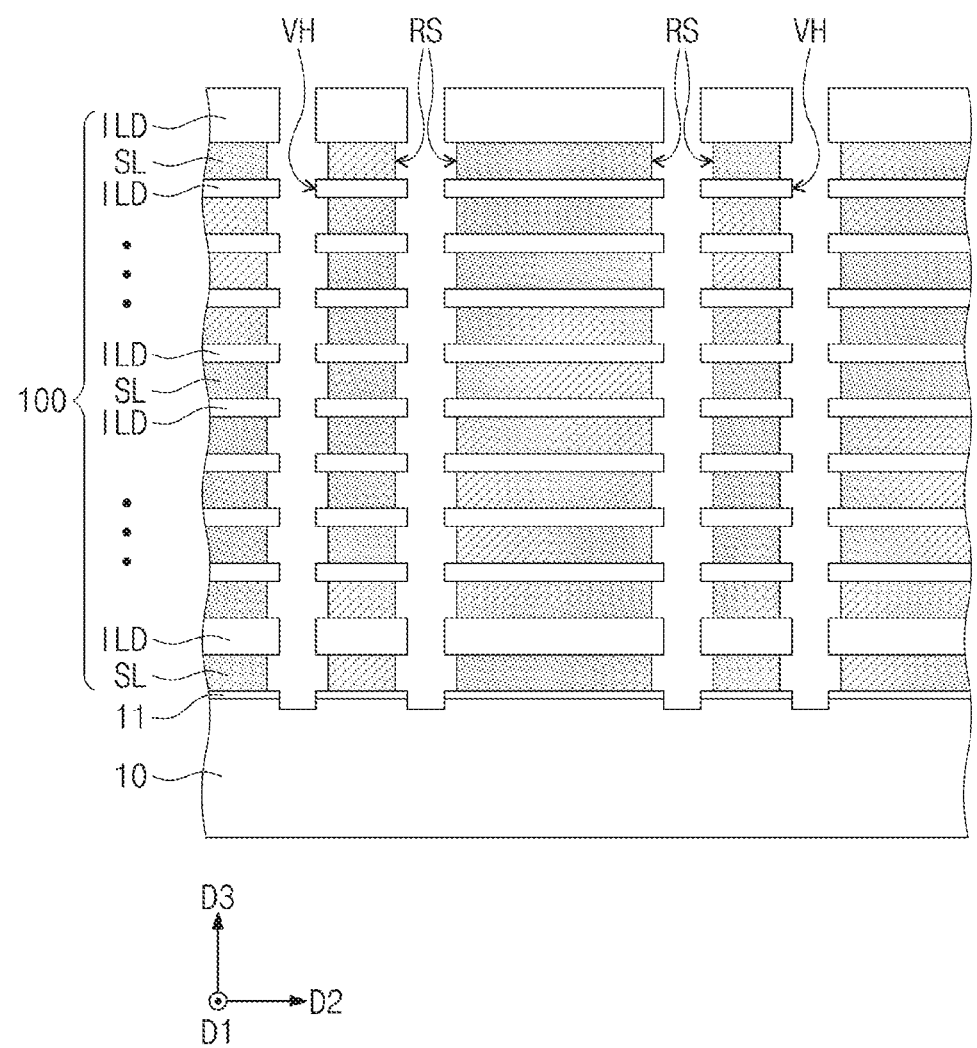

Referring to FIGS. 2 and 11, in exemplary embodiments, the sacrificial layers SL exposed by the vertical holes VH are laterally recessed to form recess regions RS between vertically adjacent insulating layers ILD. The recess regions RS may be formed to have a diameter that is larger than that of the vertical holes VH. The recess regions RS may be formed by isotropically and partially etching the sacrificial layers SL using an etch recipe having an etch selectivity with respect to the insulating layers ILD. For example, in a case in which the sacrificial layers SL are formed of silicon nitride and the insulating layers ILD are formed of silicon oxide, the recess regions RS may be formed by an isotropic etching process in which an etching solution containing phosphoric acid is used. In exemplary embodiments, the recess regions RS are formed in a side surface of the electrode structure ST in areas corresponding to the gate electrodes GE, and the first charge trap layer CT1 is formed in the recess regions RS. For example, in exemplary embodiments, the recess regions RS are formed in a side surface of the electrode structure ST toward the gate electrodes GE.

Figure 12:
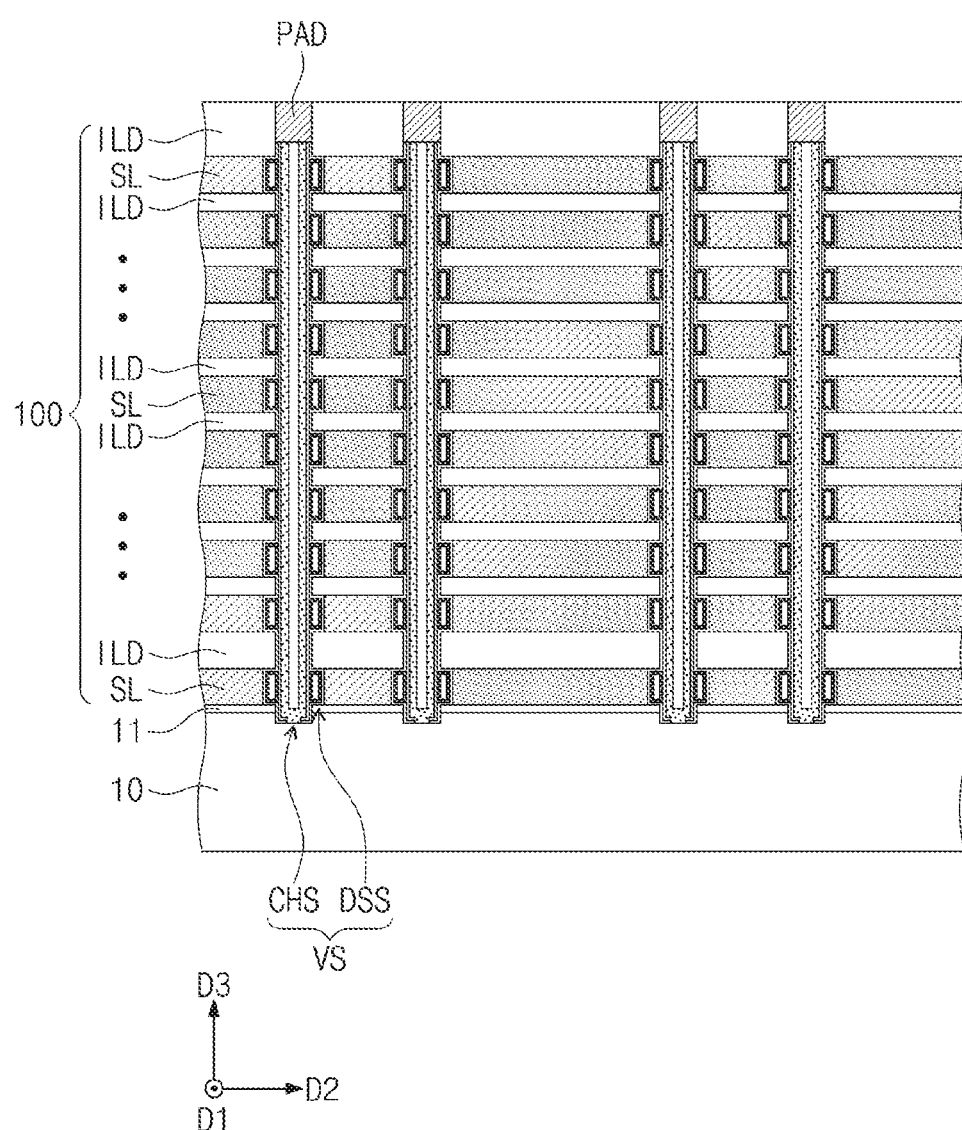

Referring to FIGS. 2 and 12, in exemplary embodiments, the vertical structures VS are formed in the recess regions RS and the vertical holes VH. The formation of the vertical structures VS may include forming the data storing structure DSS in the recess regions RS and the vertical holes VH, forming the channel structure CHS, and forming the bit line conductive pad PAD in or on a top portion of the channel structure CHS. The vertical structures VS may be formed to be thicker near the sacrificial layers SL than near the insulating layers ILD. A method of forming the vertical structures VS will be described in more detail with reference to FIGS. 16 to 20.

Figure 13:
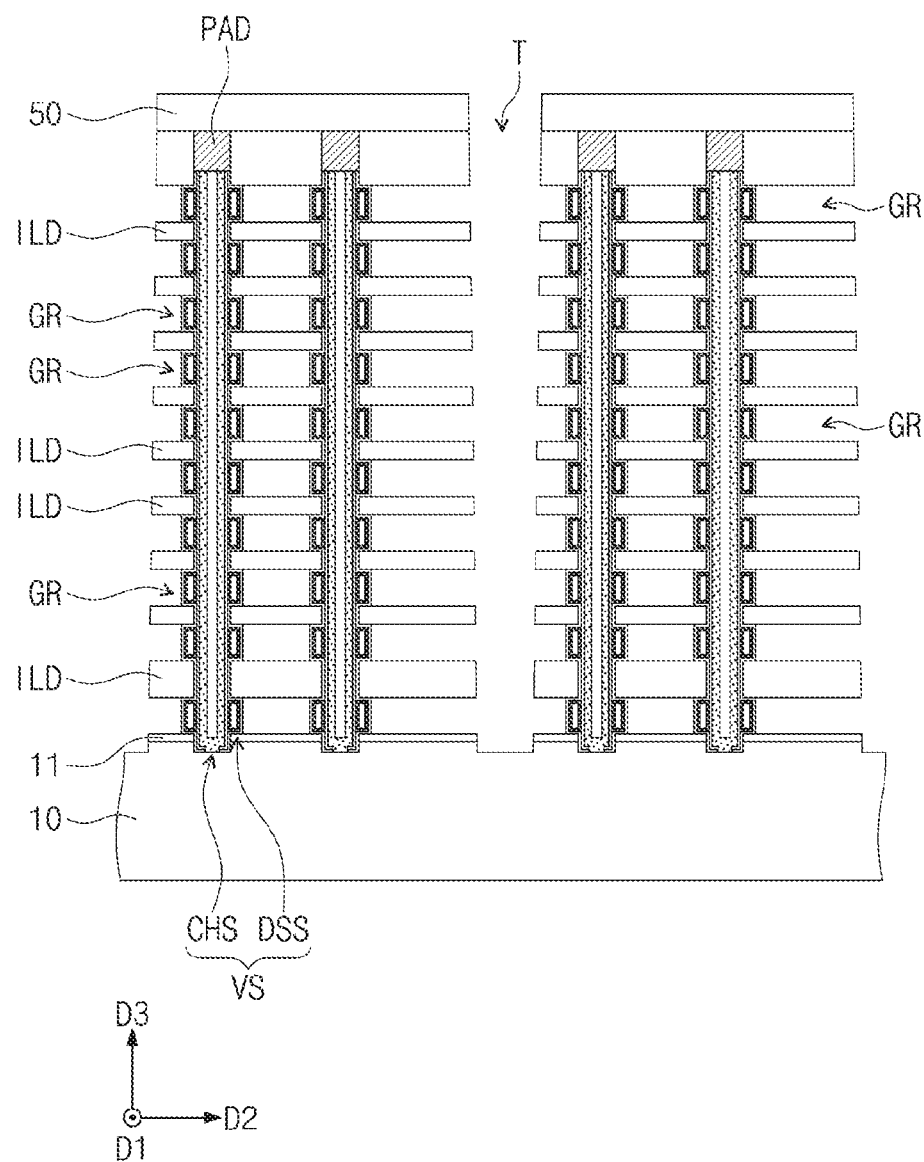

Referring to FIGS. 2 and 13, in exemplary embodiments, after the formation of the vertical structures VS, the first interlayered insulating layer 50 is formed on the mold structure 100. The first interlayered insulating layer 50 covers top surfaces of the vertical structures VS. Thereafter, the first interlayered insulating layer 50 and the mold structure 100 may be patterned to form trenches T exposing the substrate 10. As a result of the formation of the trenches T, the mold structure 100 may be patterned to have a line shape extending in a direction.

In exemplary embodiments, the trenches T are formed such that they are spaced apart from the vertical structures VS, and expose side surfaces of the sacrificial and insulating layers SL and ILD. Each of the trenches T may be formed to have a line or rectangular shape extending in the first direction D1 when viewed in a plan view, and to expose the top surface of the substrate 10 when viewed in a cross-sectional view. The trenches T may be formed in an over-etching manner, and thus, the top surface of the substrate 10 exposed by the trenches T may be recessed to a specific depth. Furthermore, the trenches T may be formed using an anisotropic etching process, but may have a side surface that is inclined at an angle toward the top surface of the substrate 10.

Thereafter, the sacrificial layers SL exposed by the trenches T are removed to form gate regions GR between the insulating layers ILD. The gate regions GR may be formed, for example, by isotropically etching the sacrificial layers SL using an etch recipe having an etch selectivity with respect to the buffer insulating layer 11, the insulating layers ILD, the vertical structures VS, and the substrate 10. In exemplary embodiments, the sacrificial layers SL may be completely removed by the isotropic etching process. For example, in a case in which the sacrificial layers SL are formed of silicon nitride and the insulating layers ILD are formed of silicon oxide, the recess regions RS may be formed by an isotropic etching process using an etching solution containing phosphoric acid.

Furthermore, each of the gate regions GR may be an empty space horizontally extended from the trench T and located between the insulating layers ILD, and may be formed to expose a portion of a side surface of the data storing structure DSS. For example, in exemplary embodiments, each of the gate regions GR is an empty space defined by an adjacent pair of the insulating layers ILD and the side surface of the data storing structure DSS.

Figure 14:
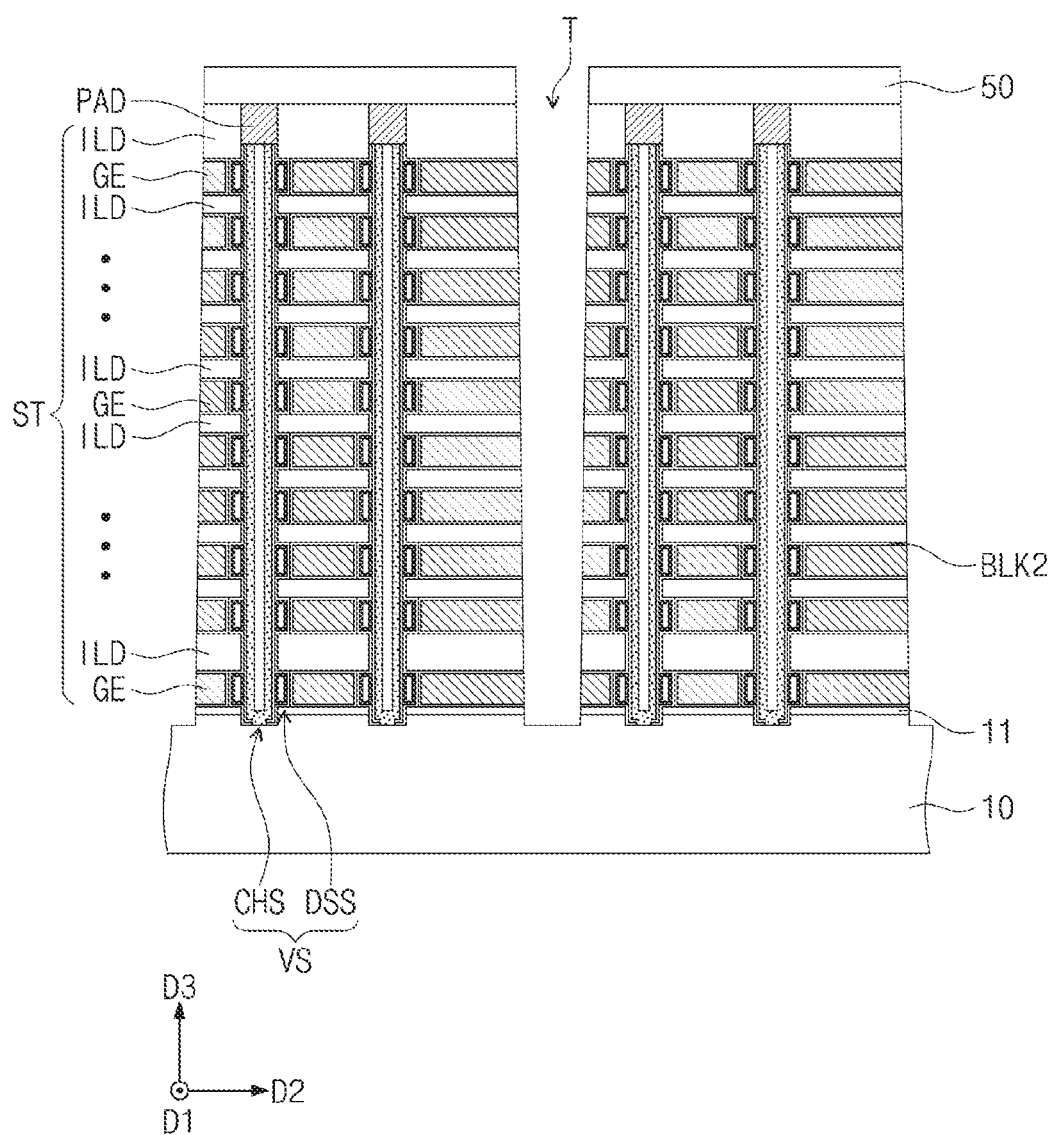

Referring to FIGS. 2 and 14, in exemplary embodiments, the second blocking insulating layer BLK2 is formed to conformally cover inner surfaces of the gate regions GR. For example, the second blocking insulating layer BLK2 may be formed to have a substantially uniform thickness on the inner surfaces of the gate regions GR. The second blocking insulating layer BLK2 may be composed of a single layer or a plurality of layers.

The gate electrodes GE are formed in the gate regions GR covered with the second blocking insulating layer BLK2. Each of the gate electrodes GE may be formed to partially or completely fill a corresponding one of the gate regions GR.

The formation of the gate electrodes GE may include, for example, forming a gate conductive layer to fill the gate regions provided with the second blocking insulating layer BLK2 and then removing the gate conductive layer from the trenches T to localize the gate electrodes GE in the gate regions, respectively. Each of the gate electrodes GE may include a barrier metal layer and a metal layer that are sequentially deposited. The barrier metal layer may be formed of or include at least one of metal nitride materials (e.g., TiN, TaN, and WN). The metal layer may be formed of or include at least one of metallic materials (e.g., W, Al, Ti, Ta, Co, and Cu).

As a result of the formation of the gate electrodes GE, the electrode structures ST may be formed on the substrate 10. Each of the electrode structures ST include the insulating layers ILD and the gate electrodes GE, which are alternately stacked on the substrate 10. The electrode structures ST extend in the first direction D1, and side surfaces of the electrode structures ST are exposed by the trench T. In addition, the substrate 10 is exposed between adjacent electrode structures ST when viewed in a plan view.

Figure 15:
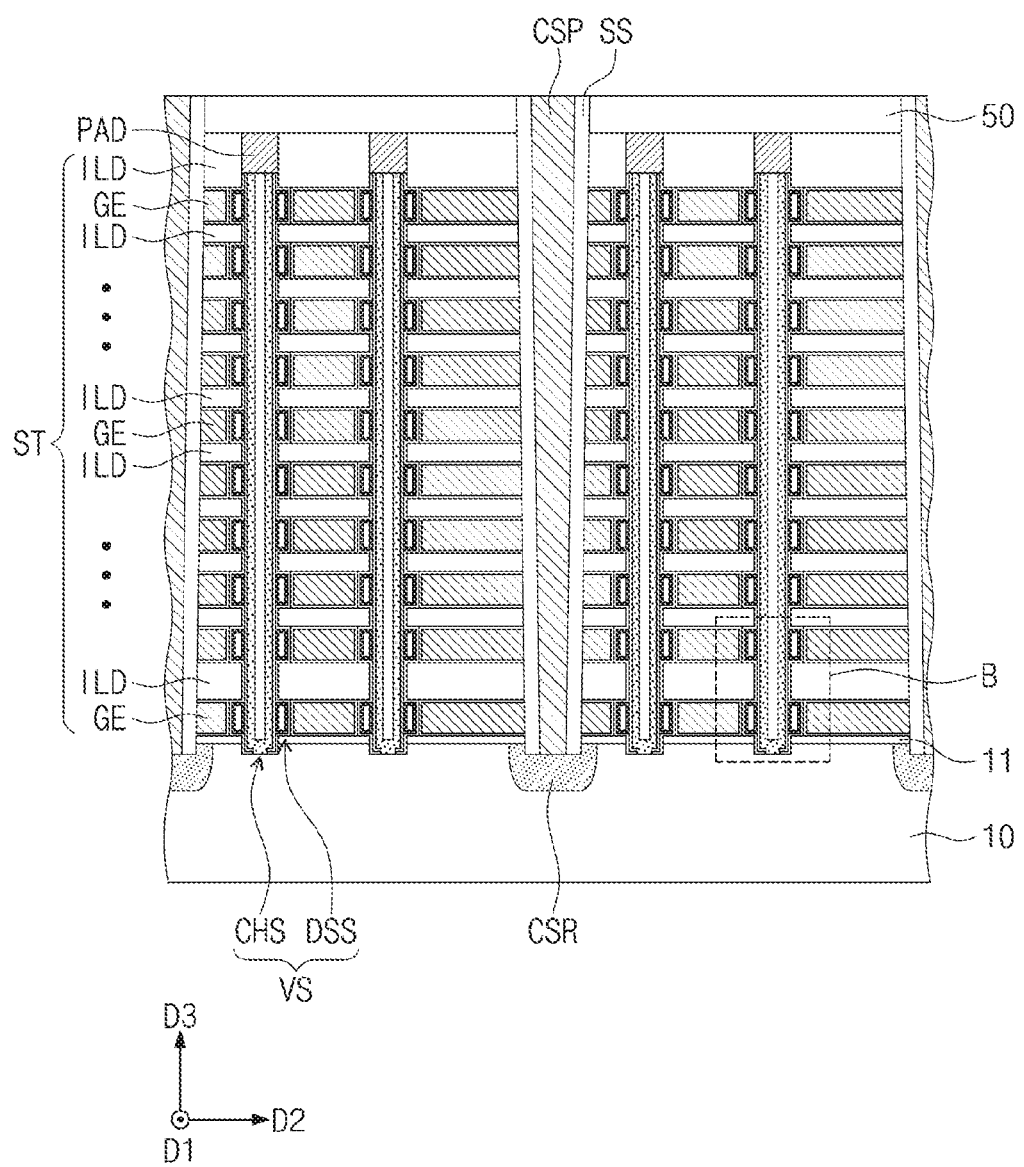

Referring to FIGS. 2 and 15, in exemplary embodiments, the common source regions CSR are formed in portions of the substrate 10 exposed through the trenches T. The common source regions CSR extend in the first direction D1, extend substantially parallel to one another, and are spaced apart from one another in the second direction D2. For example, in exemplary embodiments, the common source regions CSR are formed in the substrate 10 and between the electrode structures ST. The common source regions CSR may be formed, for example, by doping impurities, whose conductivity type is different from that of the substrate 10, into the substrate 10. In exemplary embodiments, the common source regions CSR contain n-type impurities (e.g., arsenic (As) or phosphorus (P)).

In exemplary embodiments, the insulating spacer SS is formed to cover side surfaces of the trenches T. The formation of the insulating spacer SS may include conformally depositing a spacer layer on the substrate 10 provided with the electrode structures ST, and then performing an etchback process on the spacer layer to expose the common source region CSR. The spacer layer may be formed of at least one of insulating materials (e.g., silicon oxide, silicon nitride, silicon oxynitride, or low-k dielectric materials).

In exemplary embodiments, the common source plug CSP is formed in each of the trenches T with the insulating spacer SS. The common source plug CSP extends substantially parallel to the gate electrodes GE.

Next, as shown in FIG. 3, the second interlayered insulating layer 60 is formed on the first interlayered insulating layer 50 to cover the top surface of the common source plug CSP. Thereafter, the bit line contact plugs BPLG are formed to penetrate the first and second interlayered insulating layers 50 and 60, and to be coupled to the bit line conductive pads PAD. Next, the bit lines BL are formed on the second interlayered insulating layer 60. The bit lines BL extend in the second direction D2 and are coupled to the bit line contact plugs BPLG.

FIGS. 16 to 20 are cross-sectional views illustrating a method of forming vertical structures of a three-dimensional semiconductor memory device according to exemplary embodiments of the inventive concept. FIGS. 16 to 20 correspond to a portion B of FIG. 15.

Figure 16:
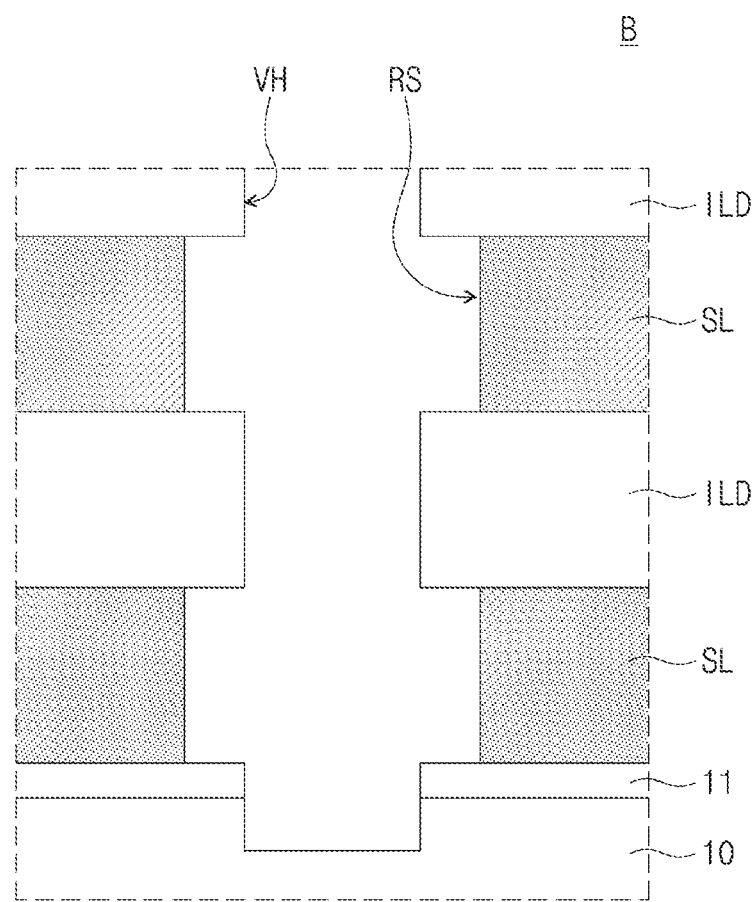
FIGS. 16 to 20 are cross-sectional views illustrating a method of forming vertical structures of a three-dimensional semiconductor memory device according to exemplary embodiments of the inventive concept.

Referring to FIG. 16, as described above, in exemplary embodiments, the vertical holes VH are formed to penetrate the mold structure 100, and then the recess regions RS are formed by recessing the side surfaces of the sacrificial layers SL. The recess regions RS are formed to have a diameter that is larger than that of the vertical holes VH. The top surface of the substrate 10 may be vertically recessed during the formation of the vertical holes VH, and thus, a bottom surface of the vertical hole VH may be positioned at a level lower than that of the top surface of the substrate 10.

Figure 17:
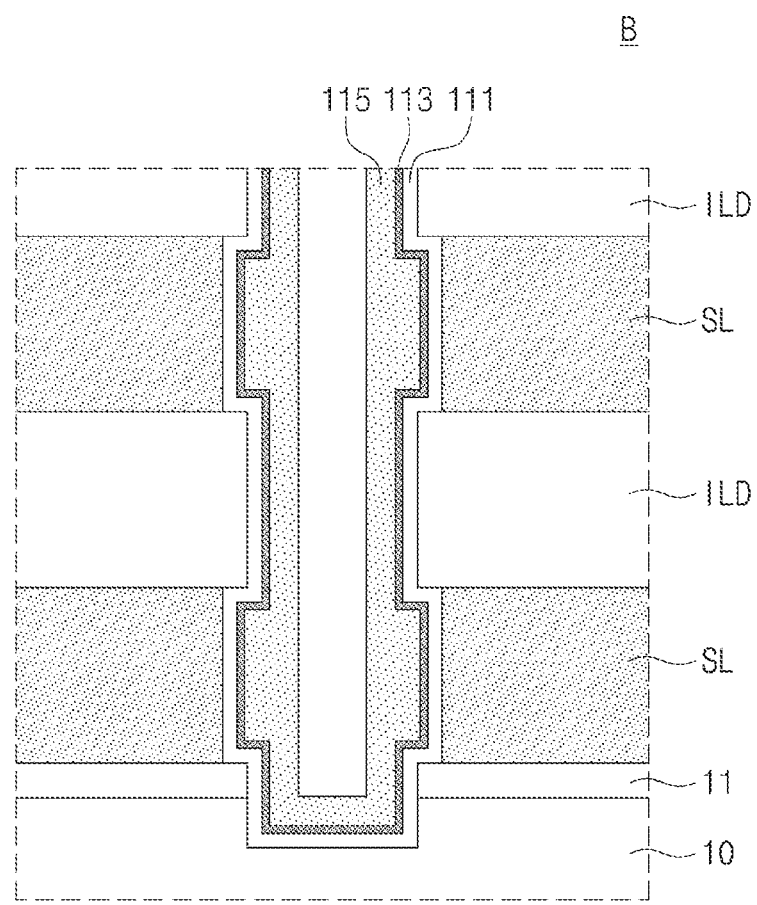

Referring to FIG. 17, in exemplary embodiments, a first preliminary blocking insulating layer 111, a second preliminary charge trap layer 113, and a first preliminary charge trap layer 115 are formed to sequentially cover inner surfaces of the vertical holes VH and the recess regions RS. In exemplary embodiments, a sum of thicknesses of the first preliminary blocking insulating layer 111, the second preliminary charge trap layer 113, and the first preliminary charge trap layer 115 is smaller than about half the diameter of the vertical holes VH.

In exemplary embodiments, the first preliminary blocking insulating layer 111 and the second preliminary charge trap layer 113 are formed to conformally cover the inner surfaces of the vertical holes VH and the recess regions RS (e.g., with a uniform thickness). The first preliminary charge trap layer 115 may be formed to fill the recess regions RS on which the first preliminary blocking insulating layer 111 and the second preliminary charge trap layer 113 are disposed.

Figure 18:
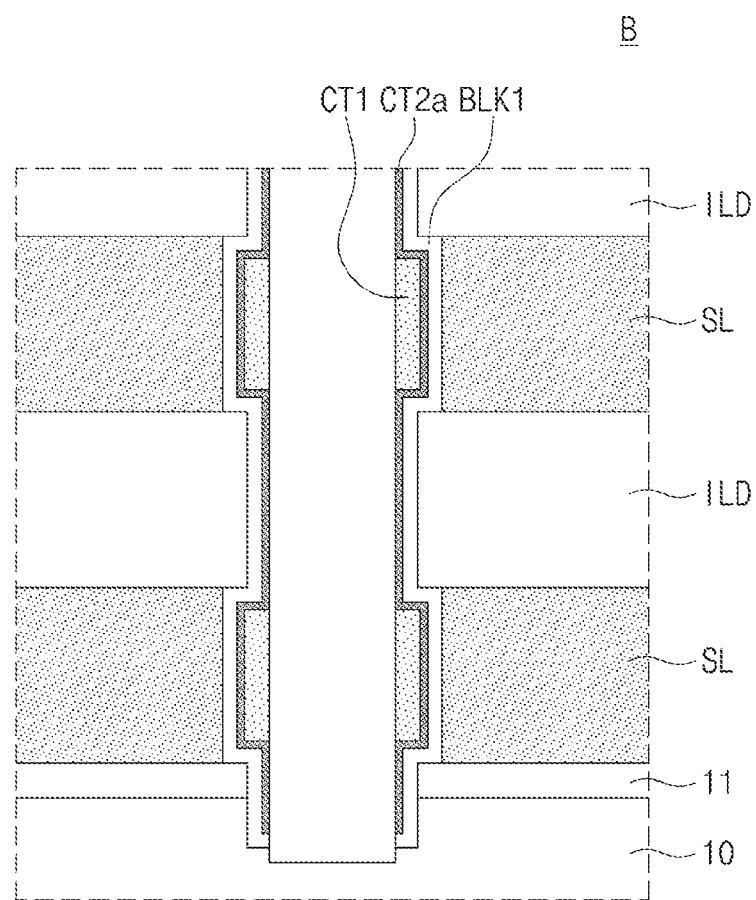

Referring to FIG. 18, in exemplary embodiments, an anisotropic etching process is performed on the first preliminary charge trap layer 115, the second preliminary charge trap layer 113, and the first preliminary blocking insulating layer 111, which are formed in the vertical holes VH, thereby forming penetration holes exposing the top surface of the substrate 10 through the vertical holes VH. As a result of the formation of the penetration holes, the first blocking insulating layer BLK1, a second charge trap layer CT2a, and a plurality of first charge trap layers CT1 are formed. The first charge trap layers CT1 may be locally formed in the recess regions RS, and may be spaced apart from one another in a direction substantially perpendicular to the top surface of the substrate 10.

In exemplary embodiments, a method of isotropically etching the first preliminary charge trap layer 115 is used to locally form the first charge trap layers CT1 in the recess regions RS. In this case, side surfaces of the first charge trap layers CT1 may be horizontally recessed compared with a side surface of the second charge trap layer CT2a.

Figure 19:
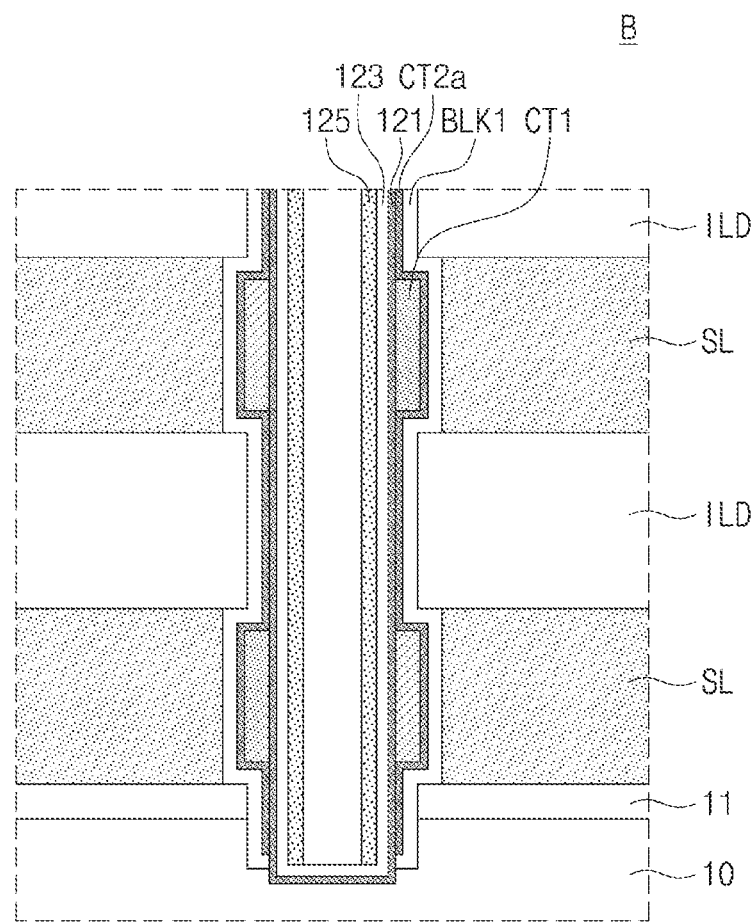

Referring to FIG. 19, in exemplary embodiments, a third preliminary charge trap layer 121, a preliminary tunnel insulating layer 123, and a first semiconductor layer 125 are sequentially deposited to conformally cover inner surfaces of the vertical holes VH, in which the first blocking insulating layer BLK1, the second charge trap layer CT2a, and the first charge trap layers CT1 are disposed. The third preliminary charge trap layer 121, the preliminary tunnel insulating layer 123, and the first semiconductor layer 125 may define an empty space in each of the vertical holes VH. The third preliminary charge trap layer 121 may be formed of or include the same material as the second charge trap layer CT2a. In exemplary embodiments, a process of depositing the third preliminary charge trap layer 121 is omitted, before the deposition of the preliminary tunnel insulating layer 123. In exemplary embodiments, the preliminary tunnel insulating layer 123 is formed by performing a thermal oxidation process on the first charge trap layers CT1.

Thereafter, in exemplary embodiments, an anisotropic etching process is performed on the third preliminary charge trap layer 121, the preliminary tunnel insulating layer 123, and the first semiconductor layer 125 to expose the substrate 10. As a result, a third charge trap layer CT2b, the tunnel insulating layer TIL, and a first semiconductor pattern SP1 may be formed, as shown in FIG. 20.

Figure 20:
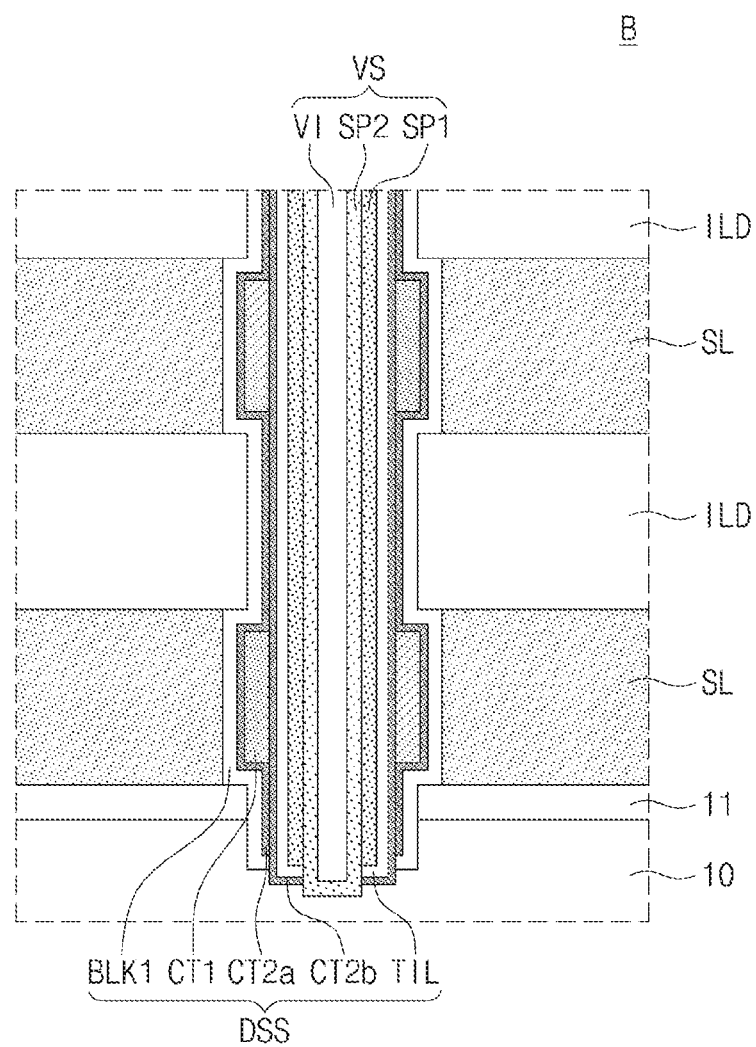

Referring to FIG. 20, in exemplary embodiments, a second semiconductor layer SP2 is deposited to conformally cover a side surface of the first semiconductor pattern SP1 and the substrate 10, and an empty space defined by the second semiconductor layer SP2 is filled with the buried insulating pattern VI.

According to exemplary embodiments of the inventive concept, a charge storing layer adjacent to gate electrodes includes first and second charge trap layers having different energy band gaps. As a result, exemplary embodiments prevent or suppress electric charges, which are trapped in the charge storing layer, from being spread in a horizontal direction substantially parallel to a top surface of a substrate. Furthermore, according to exemplary embodiments, a data storing structure is configured to include first charge trap layers, which have a deep trap level and are spaced apart from one another in a direction substantially perpendicular to the top surface of the substrate. As a result, exemplary embodiments prevent or suppress electric charges, which are trapped in the charge storing layer, from being spread in a vertical direction substantially perpendicular to the top surface of the substrate. For example, a three-dimensional semiconductor memory device according to exemplary embodiments of the inventive concept prevents or suppresses electric charges, which are trapped in the charge storing layer, from being spread in the vertical and horizontal directions. Accordingly, exemplary embodiments reduce loss of electric charges trapped in the charge storing layer, and thereby may improve a charge retention property of a three-dimensional semiconductor memory device. As a result, a three-dimensional semiconductor memory device with improved reliability is provided.

According to exemplary embodiments of the inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

According to exemplary embodiments of the inventive concept, the 3D memory array includes vertical NAND strings that are vertically oriented such that at least one memory cell is located over another memory cell. The at least one memory cell may include a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that variations in form and detail may be made therein without departing from the spirit and scope of the present inventive concept as defined by the following claims.

What is claimed is:

1. A three-dimensional semiconductor memory device, comprising:
    an electrode structure comprising a plurality of gate electrodes and a plurality of insulating layers, wherein the gate electrodes and the insulating layers are alternately stacked on a substrate;
    a semiconductor pattern extending in a first direction substantially perpendicular to a top surface of the substrate and penetrating the electrode structure;
    a tunnel insulating layer disposed between the semiconductor pattern and the electrode structure;
    a blocking insulating layer disposed between the tunnel insulating layer and the electrode structure; and
    a charge storing layer disposed between the blocking insulating layer and the tunnel insulating layer,
    wherein the charge storing layer comprises:
        a plurality of first charge trap layers having a first energy hand gap; and
        a second charge trap layer having a second energy band gap larger than the first energy band gap,
        wherein the first charge trap layers are completely surrounded by the second charge trap layer between the gate electrodes and the semiconductor pattern.

2. The three-dimensional semiconductor memory device of claim 1, wherein side surfaces of the insulating layers are spaced apart from a side surface of the semiconductor pattern by a first distance in a second direction substantially parallel to the top surface of the substrate, and
    side surfaces of the gate electrodes are spaced apart from the side surface of the semiconductor pattern by a second distance in the second direction, wherein the second distance is larger than the first distance.

3. The three-dimensional semiconductor memory device of claim 2, wherein the charge storing layer has a first thickness between the gate electrodes and the semiconductor pattern in the second direction, and has a second thickness between the insulating layers and the semiconductor pattern in the second direction, wherein the second thickness is smaller than the first thickness.

4. The three-dimensional semiconductor memory device of claim 2, wherein each of the first charge trap layers is thicker than the second charge trap layer in the second direction.

5. The three-dimensional semiconductor memory device of claim 1, wherein each of the first charge trap layers surrounds a portion of the semiconductor pattern.

6. The three-dimensional semiconductor memory device of claim 1, wherein the second energy band gap of the second charge trap layer is smaller than a third energy band gap of the tunnel insulating layer.

7. The three-dimensional semiconductor memory device of claim 1, wherein the first charge trap layers have a first conduction band energy level,
    the second charge trap layer has a second conduction band energy level, and
    the tunnel insulating layer has a third conduction band energy level,
    wherein a difference between the first and second conduction band energy levels is greater than a difference between the second and third conduction band energy levels.

8. The three-dimensional semiconductor memory device of claim 1, wherein the second charge trap layer is disposed between the first charge trap layers and the blocking insulating layer, the second charge trap layer is disposed between the first charge trap layers and the tunnel insulating layer, and the second charge trap layer covers top and bottom surfaces of the first charge trap layers.

9. The three-dimensional semiconductor memory device of claim 1, wherein the second charge trap layer is disposed between the gate electrodes and the semiconductor pattern, and the second charge trap layer is disposed between the insulating layers and the semiconductor pattern.

10. The three-dimensional semiconductor memory device of claim 1, wherein the blocking insulating layer and the tunnel insulating layer extend in the first direction, and the blocking insulating layer contacts the tunnel insulating layer in an area between the insulating layers and the semiconductor pattern.

11. The three-dimensional semiconductor memory device of claim 1, wherein the first charge trap layers comprise polysilicon, germanium (Ge), tungsten (W), nickel (Ni), or platinum (Pt), and the second charge trap layer comprises silicon nitride or silicon oxynitride.

12. A three-dimensional semiconductor memory device, comprising:
- an electrode structure comprising a plurality of gate electrodes and a plurality of insulating layers,
- wherein the gate electrodes and the insulating layers are alternately stacked on a substrate, and a side surface of the electrode structure is recessed in areas corresponding to the gate electrodes to define a plurality of recess regions;
- a semiconductor pattern extending in a first direction substantially perpendicular to a top surface of the substrate and crossing the side surface of the electrode structure;
- a plurality of first charge trap layers respectively disposed in the recess regions of the electrode structure, wherein the first charge trap layers surround the semiconductor pattern;
- a tunnel insulating layer disposed between the first charge trap layers and the semiconductor pattern;
- a blocking insulating layer disposed between the first charge trap layers and the electrode structure; and
- a second charge trap layer,
- wherein the second charge trap layer continuously extends between the blocking insulating layer and the first charge trap layers, and the second charge trap layer continuously extends between the tunnel insulating layer and the first charge trap layers,
- wherein the first charge trap layers are formed of a material having a first energy band gap, and the second charge trap layer is formed of a material having a second energy band gap larger than the first energy band gap.

13. The three-dimensional semiconductor memory device of claim 12, wherein the second charge trap layer contacts top and bottom surfaces of each of the first charge trap layers.

14. The three-dimensional semiconductor memory device of claim 12, wherein the second charge trap layer extends in the first direction, the second charge trap layer is disposed between the tunnel insulating layer and the first charge trap layers, and the second charge trap layer is disposed between the tunnel insulating layer and the blocking insulating layer.

15. The three-dimensional semiconductor memory device of claim 12, wherein the blocking insulating layer contacts the tunnel insulating layer in an area between the insulating layers and the semiconductor pattern.

16. The three-dimensional semiconductor memory device of claim 12, wherein the blocking insulating layer extends in the first direction, and conformally covers the recess regions of the electrode structure.

17. The three-dimensional semiconductor memory device of claim 12, wherein the second energy band gap of the second charge trap layer is smaller than a third energy band gap of the tunnel insulating layer.

18. The three-dimensional semiconductor memory device of claim 12, wherein the first charge trap layers have a first conduction hand energy level,
- the second charge trap layer has a second conduction hand energy level, and
- the tunnel insulating layer has a third conduction band energy level,
- wherein a difference between the first and second conduction band energy levels is greater than a difference between the second and third conduction band energy levels.

19. The three-dimensional semiconductor memory device of claim 12, wherein the tunnel insulating layer extends in the first direction and surrounds a side surface of the semiconductor pattern.

20. The three-dimensional semiconductor memory device of claim 12, wherein a thickness of the second charge trap layer is smaller than a thickness of each of the first charge trap layers in a second direction, wherein the second direction is substantially parallel to the top surface of the substrate.

* * * * *